United States Patent [19]

Matsuoka et al.

[11] Patent Number: 4,941,915
[45] Date of Patent: Jul. 17, 1990

[54] THIN FILM FORMING APPARATUS AND ION SOURCE UTILIZING PLASMA SPUTTERING

[75] Inventors: Morito Matsuoka, Katsuta; Ken'ichi Ono, Mito, both of Japan

[73] Assignee: Nippon Telegraph and Telephone Corporation, Tokyo, Japan

[21] Appl. No.: 307,342

[22] Filed: Feb. 7, 1989

[30] Foreign Application Priority Data

| Feb. 8, 1988 | [JP] | Japan | 63-25603 |
| Feb. 8, 1988 | [JP] | Japan | 63-25604 |
| Aug. 12, 1988 | [JP] | Japan | 63-200113 |

[51] Int. Cl.⁵ .................. C23C 14/35; H01J 27/02
[52] U.S. Cl. .................. 204/298.12; 204/192.11; 204/192.34; 204/298.01; 204/298.02; 250/423 R
[58] Field of Search .................. 204/192.11, 192.12, 204/192.31, 192.32, 192.34, 298 R, 298 BD, 298 PI, 298 TT, 298 TS, 298 ME, 298 FP, 298 SG, 298 CM, 298 BE; 250/423 R, 492.3; 313/618, 619

[56] References Cited

U.S. PATENT DOCUMENTS

| 3,616,450 | 10/1971 | Clark | 204/298 |
| 3,878,085 | 4/1975 | Corbani | 204/298 |
| 4,041,353 | 8/1977 | Penfold et al. | 315/267 |
| 4,046,660 | 9/1977 | Fraser | 204/192.12 |
| 4,175,029 | 11/1979 | Kovalsky et al. | 204/298 |
| 4,690,744 | 9/1987 | Naoe et al. | 204/192.11 |

FOREIGN PATENT DOCUMENTS

| 60-50167 | 3/1985 | Japan | 204/298 |
| 60-130039 | 7/1985 | Japan | 250/423 R |
| 60-195855 | 10/1985 | Japan | 250/423 R |
| 62-222064 | 9/1987 | Japan | 204/298 |
| 62-224686 | 10/1987 | Japan | 204/298 |

OTHER PUBLICATIONS

"Aluminum Films Deposited by rf Sputtering", F. M. D'Heurle; *Metallurgical Transactions*, vol. 1, 1970 pp. 725-732.

"Planar Magnetron Sputtering", Robert K. Waits; *J. Vac. Sci. Technol.*, 15 (2), (1978) pp. 179-187.

"rf and dc Discharge Characteristics for Opposed-Targets Sputtering", M. Matsuoka, Y. Hoshi and M. Naoe; *J. Appl. Phys.*, 60 (6) (1986) pp. 2096-2102.

"Developments in Broad-Beam, Ion-Source Technology and Applications", H. R. Kaufman, J. M. E. Harper, and J. J. Cuomo; *J. Vac Sci. Technol.*, 21 (3) (1987) pp. 1332-1339.

"A Low-Energy Metal-Ion Source for Primary Ion Deposition and Accelerated Ion Doping During Molecular-Beam Epitaxy", M. A. Hasan, J. Knall, A. Barnett, A. Rockett, J. E. Sundgren, and J. E. Greene; *J. Vac. Sci. Technol.*, vol. B5 (1987), pp. 1332-1339.

"Anode Sputtering Characteristics of the Berkeley 2.5 MV Source", B. Gavin; *IEEE Trans. Nucl. Sci.*, NS-23 (1976) pp. 1008-1012.

"A New Sputtering Type of Ion Source For Ion Beam Deposition of Thin Films", N. Terada, et al. *Proc Int'l Ion Engineering Congress* ISIAT '83 & IPAT '83, 1983 pp. 999-1004.

*Primary Examiner*—Aaron Weisstuch
*Attorney, Agent, or Firm*—Cushman, Darby & Cushman

[57] ABSTRACT

A thin film forming apparatus comprising a plasma generating chamber into which is introduced a gas to generate plasma; a first target and a second target which are made of a material to be sputtered and are disposed in the vicinity of both end portions of interior of the plasma generating chamber, respectively, at least one of the first and second targets having the form of a cylinder; at least one power supply for applying a negative potential to the first and second targets; an electromagnet adapted to establish the magnetic field within the plasma generating chamber and inducing the magnetic flux leaving one of the first and second targets and entering the other; and a specimen chamber which incorporates therein a substrate holder and is communicated to one end of the plasma generating chamber on the side of the cylindrical target. High density plasma generated in the plasma generating chamber sputters the targets so that sputtered substances which constituted the targets are deposited over the surface of a substrate, thereby forming a thin film.

19 Claims, 33 Drawing Sheets

THIN FILM FORMING APPARATUS AND ION SOURCE UTILIZING PLASMA SPUTTERING

BACKGROUND OF THE INVENTION

1. Field of the Invention

The present invention relates to apparatuses for forming thin films on specimen substrates and apparatuses for extracting ions for forming thin films on specimen substrates, etching the surface of a thin film or improving the quality of the surface of a thin film, and more particularly a novel film forming apparatus capable of forming thin films of various materials at a high film growing rate with a high efficiency and stability for a long period of time by utilizing high-density plasma and a novel sputtering type ion source cable of extracting various ions of high current density with a high efficiency and stability for a long period of time. Furthermore, the present invention relates to a plasma generating apparatus which is capable of generating high-density plasma in a gas under a low pressure and which can be utilized with the film forming apparatus and the ion source.

2. Description of the Prior art

In various types of LSI production processes, the techniques regarding to the formation of thin films and to ion sources presently occupy very important positions.

The sputtering apparatuses for forming thin films by sputtering targets in a plasma have been widely used for the formation of thin films of various materials and among them the so-called two-electrode (rf, dc) sputtering apparatus in which a target and a substrate are disposed in opposing relationship and are spaced apart from each other by a predetermined distance (for instance, as is disclosed by F. M. D'Heurle, *Metallurgical Transactions*, Vol. 1, (1970), pp.725–732) is most popular among those skilled in the art. Referring to FIG. 1, this apparatus comprises a vacuum chamber 4 in which are disposed a target 1 and a substrate 2 over the upper surface of which a thin film is grown, a gas introduction system 5 and an exhaust system 6 and a thin film is formed over the surface of the substrate by sputtering the target 1 by plasma 3 generated within the vacuum chamber 4.

In the cases of the conventional sputtering apparatuses, in order to increase the deposition rate of a thin film, plasma must inevitably be maintained in a high density state. In the case of the sputtering apparatus as shown in FIG. 1, the higher the density of plasma, the more rapidly the voltage applied to the target rises, so that the substrate is quickly heated and thin films formed are damaged by the impact due to the incidence of high-energy particles or (high-energy) electrons in the plasma. As a result, high-rate sputtering deposition can be carried out only with special heat-resisting substrates, materials and compositions of thin films.

Furthermore, in the conventional sputtering apparatuses, the discharge cannot be maintained in a stable manner in a low gas pressure range less than $10^{-3}$ Torr and plasma is generated only at a gas pressure of the order of $10^{-2}$ Torr or higher, so that there arises the problem that a large amount of impurities is penetrated into the thin film.

The particles which contribute to the growth of a thin film are almost neutral and it has been difficult to control the energy of such neutral particles.

Meanwhile, the magnetron sputtering apparatuses (for instance, as disclosed by R. K. Waits, *J. Vac. Sci. Technol.*, Vol. 15 (1978), pp.179–187) and the facing targets sputtering apparatuses (for instance, as disclosed by M. Matsuoka et al., *J. Appl. Phys.*, Vol. 60 (1986), pp.2096–2102) which permit a high-rate sputtering in a gas under a low pressure have been devised and demonstrated.

In the magnetron sputtering apparatuses, the high-energy secondary electrons are trapped over the surface of the target by the effects of the magnetic field closed over the surface of the target and the electric field over the surface of the target so that high-density plasma can be generated in a gas at a low pressure. However, they have the problem that the qualities of the portions of a grown film corresponding to the eroded portions of the target to the not eroded portions, respectively, are widely different from each other. Furthermore, when the target is made of a magnetic material such as Fe, the magnetic flux does not leak to the surface of the target so that high-density plasma cannot be generated and the kinds of thin films to be formed are limited.

In the facing targets sputtering apparatuses, as shown in FIG. 2, the magnetic fields produced by permanent magnets 7 are applied between the targets 1 arranged in opposing relationship with each other so that the high-energy secondary electrons are confined between the targets to generate high-density plasma therebetween. They have the special feature that almost all kinds of thin films can be formed over the surface of the substrate 2 at a high deposition rate. The substrate 2 can be heated by a heater 8. In this apparatus, the impingement of the high-energy particles on the surface of the substrate is decreased so that this apparatus is regarded as one of the better apparatuses for forming a high quality thin film at low temperatures. However, the targets 1 are disposed in opposing relationship and are spaced apart from each other by a suitable distance, so that the substrate 2 must be located at a horizontal position and the deposition rate of the sputtered particles deposited over the surface of the substrate 2 is low. Furthermore, in the case of coating a large surface of a large-sized disc or the like, there arises the problem that the deposition rate or efficiency is essentially low when the targets are disposed in the manner described above.

Meanwhile, the ion sources which utilize an ion extracting mechanism such as a grid to extract the ions produced in plasma have been widely used for forming thin films of various materials, etching the surface of a formed thin film, processing the formed thin films and so on. Among them, the Kaufman type ion source provided with a filament for emitting thermal electrons so as to produce plasma (for instance, as disclosed by R. H. Kaufman et al., *J. Vac. Sci. Technol.*, Vol. 21 (1982), pp.764–767) has been especially widely used. As shown in FIG. 3, in the Kaufman type ion source, disposed within the plasma generating chamber (vacuum chamber) 4 is a filament 9 for emitting thermal electrons. The filament 9 is used as a cathode so as to trigger the discharge in the magnetic field produced by an electromagnet 10 adapted to produce the magnetic field in order to stabilize plasma so that plasma 11 is produced. The ions in the plasma 11 are extracted by a plurality of ion extracting grids 12, as an ion beam 13.

The conventional ion sources which are typically represented by the Kaufman type ion source utilize the thermal electrons emitted from the filament to generate plasma so that the material of the filament itself is also sputtered and is included in the ions being extracted. Furthermore, when a reactive gas such as oxygen is used as a gas for generating plasma, it chemically reacts with the filament so that the ion extraction cannot be continued for a long period of time. In addition, the ion extraction is limited only to the use of gases such as Ar.

As the metal ion sources, the evaporation type ion sources and the sputtering type ion sources are well known to those skilled in the art. However, the evaporation type ion source must maintain the temperature within its furnace at high temperature, so that the vaporized particles are ionized and consequently impurities most frequently tend to be contained in a thin film being grown. Furthermore, the extraction of ions of a material having a high melting point is difficult (for instance, as disclosed by M. A. Hasan et al., *J. Vac. Sci. Technol.*, Vol. B5 (1987), pp.1332–1339). In the cases of the sputtering type ion sources, metal ions obtained by sputtering a target in plasma are selectively extracted, but it is difficult to extract high-current ions over a large area (for instance, as reported by B. Gavin, *IEEE Trans. Nucl. Sci.*, Vol. NS-23 (1976), pp.1008–1012).

In order to realize a high-current ion source by utilizing sputtering, the plasma density must be maintained at a high level with a high efficiency. To this end, the secondary electrons emitted from the target must be efficiently confined, but the conventional ion sources cannot satisfactorily confine the secondary electrons.

An ion extracting method with a high-efficiency and a large-area is disclosed by, for instance, N. Terada et al., *Proc. Int'l Ion Engineering Congress*, ISIAT'83 and IPAT'83, Kyoto (1983), pp.999–1004. According to this method, a negative potential is applied to a pair of opposing targets so that the high-energy secondary electrons are confined between the targets by the magnetic field produced therebetween. As a result, high-density plasma can be generated and the extraction of metal ions can be realized with a high efficiency. However, according to this method, the ion extracting holes are formed through the target so that the target itself has a function of a grid means for extracting ions. As a result, it is difficult to extract ions in a stable manner for a long period of time.

As described above, the conventional film forming methods cannot satisfy the following conditions simultaneously:

(a) A thin film is formed at a high deposition rate without causing damage to the thin film being grown and the substrate and an extreme temperature rise;
(b) The energy of each particle incident on the substrate is low;
(c) The ionization ratio of plasma must be maintained at a high value;
(d) The discharge can be carried out in a gas under a low pressure; and
(e) The efficiency of the deposition of atoms or ions sputtered from the target over the surface of the substrate must be high.

In like manner, the conventional sputtering type ion source techniques cannot satisfy the following conditions simultaneously:

(a) Ions with a significant current density can be extracted in a large area, hence the yield of the ion must be high;
(b) The thin film formed must have a high purity;
(c) The control of the ion energy must be carried out in a simple manner;
(d) The extraction of almost all the ions including those of the materials having a high melting point can be carried out;
(e) The ion production process must exclude a heating and vaporizing step; and
(f) The ion extraction can be continued for a long period of time in a stable manner.

SUMMARY OF THE INVENTION

In view of the above, one of the objects of the present invention is to provide a film forming apparatus which can substantially solve the above and other problems encountered in the conventional apparatus, can carry out the sputtering process by utilizing high-density plasma generated in a low pressure gas, and can attain formation of a high-quality thin film continuously at a high deposition rate and with a high efficiency by sputtered particles with a high ionization ratio and low energy while maintaining a substrate at a low temperature and preventing damage to the substrate and the thin film being grown.

Another object of the present invention is to provide a sputtering type ion source which can extract a large yield of high-purity ions from almost all kinds of materials such as metals, inert gases, reaction gases and so on over a wide energy range for a long period of time in a stable manner.

A further object of the present invention is to provide an apparatus which can generate high-density plasma in a low pressure gas and which is adapted to be applied to the film forming apparatus and the ion source.

In the first aspect of the present invention, a thin film forming apparatus comprises:

a plasma generating chamber into which a gas is introduced to generate plasma;

a first target and a second target made of materials to be sputtered and disposed at both end portions of interior of the plasma generating chamber, respectively, at least one of the first and second targets having the form of a tube;

at least one power supply for applying a negative potential to the first and second targets;

magnetic means for establishing a magnetic field within the plasma generating chamber and inducing the magnetic flux leaving one of the first and second targets and entering the other target; and a specimen chamber communicated with the plasma generating chamber on the side of the tubular target and incorporating therein a substrate holder.

Here, one of the first and second targets may be in the form of a tube while the other is in the form of a flat plate.

Both of the first and second targets may be in the form of a tube.

Two specimen chambers may be communicated with both ends of the plasma generating chamber, respectively.

The first and second targets may be the opposite end portions, respectively, of one tubular target.

The tubular target may be a polygonal tubular target.

The thin film forming apparatus may further comprise an auxiliary magnetic field producing means for correcting the magnetic field established by the magnetic means.

In the second aspect of the present invention, an ion source comprises:

a plasma generating chamber into which is introduced a gas to generate plasma;

an ion extracting mechanism disposed in the vicinity of one end of the plasma generating chamber;

a first target and a second target made of a material to be sputtered, and disposed at both end portions of interior of the plasma generating chamber, respectively, at least one of the first and second targets having the form of a tube;

at least one power supply for applying a negative potential with respect to the plasma generating chamber to the first and second targets; and means for establishing the magnetic field within the plasma generating chamber and inducing the magnetic flux leaving one of the first and second targets and entering the other target.

Here, one of the first and second targets may be in the form of a tube while the other is in the form of a flat plate.

Both of the first and second targets may be in the form of a tube.

Two specimen chambers may be communicated with both ends of the plasma generating chamber, respectively.

The first and second targets may be the opposite end portions, respectively, of one tubular target.

The tubular target may be a polygonal tubular target.

The ion source may further comprise an auxiliary magnetic field producing means for correcting the magnetic field established by the magnetic means.

The ion source may further comprise a plasma control electrode disposed within the plasma generating chamber.

The ion extracting mechanism may comprise two perforated grids.

The ion extracting mechanism may comprise a single perforated grid.

In the third aspect of the present invention, a thin film forming apparatus, comprises:

a plasma generating chamber into which is introduced a gas to generate a plasma;

an ion extracting mechanism disposed in the vicinity of one end of the plasma generating chamber;

a first target and a second target made of a material to be sputtered and disposed at both end portions of interior of the plasma producing chamber, respectively, at least one of the first and second targets having the form of a tube;

at least one power supply for applying a negative potential with respect to the plasma generating chamber to the first and second targets;

means for establishing the magnetic field within the plasma generating chamber and inducing the magnetic flux leaving one of the first and second targets and entering the other target; and a specimen chamber communicated with the plasma generating chamber on the side of the tubular target and incorporating therein a substrate holder.

Here, the thin film forming apparatus may further comprise an auxiliary magnetic field producing means for correcting the magnetic field established by the magnetic means.

The thin film forming apparatus may further comprise a plasma control electrode disposed within said plasma generating chamber.

The ion extracting mechanism may comprise two perforated grids.

The ion extracting mechanism may comprise a single perforated grid.

In the fourth aspect of the present invention, a plasma generating apparatus, comprises:

a plasma generating chamber into which is introduced a gas to generate a plasma;

a first target and a second target made of a material to be sputtered and disposed in the vicinity of both end portions of interior of the plasma generating chamber, respectively, at least one of the first and second targets having the form of a tube;

at least one power supply for applying a negative potential to the first and second targets; and means for establishing the magnet field within the plasma generating chamber and inducing the magnetic flux leaving one of the first and second targets and entering the other target.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Referring now to the accompanying drawings, the present invention will be described in detail hereinafter.

Figure 1:
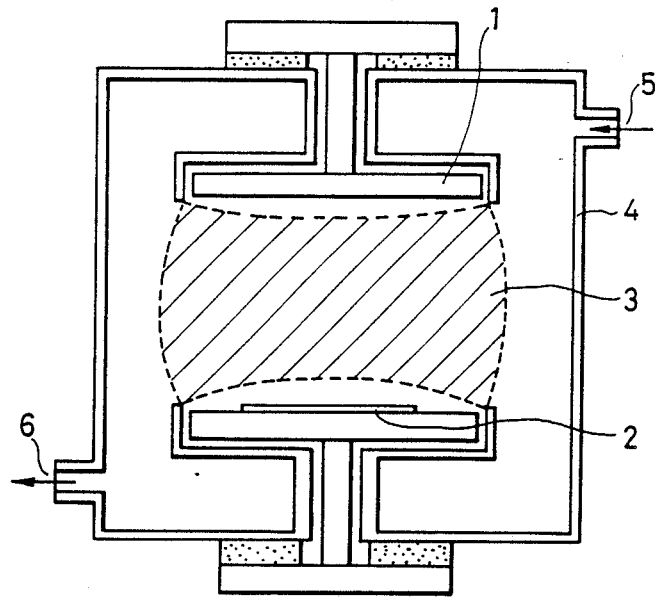
FIG. 1 is a schematic sectional view illustrating a conventional two-electrode type sputtering apparatus.
Figure 2:
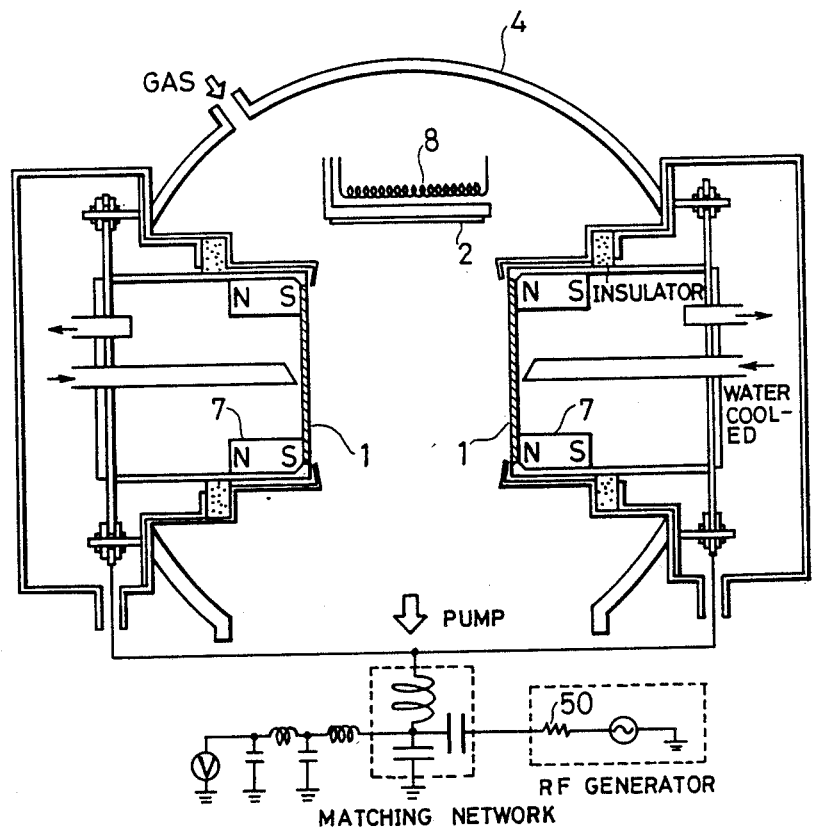
FIG. 2 is a schematic sectional view illustrating a conventional facing-targets type sputtering apparatus.
Figure 3:
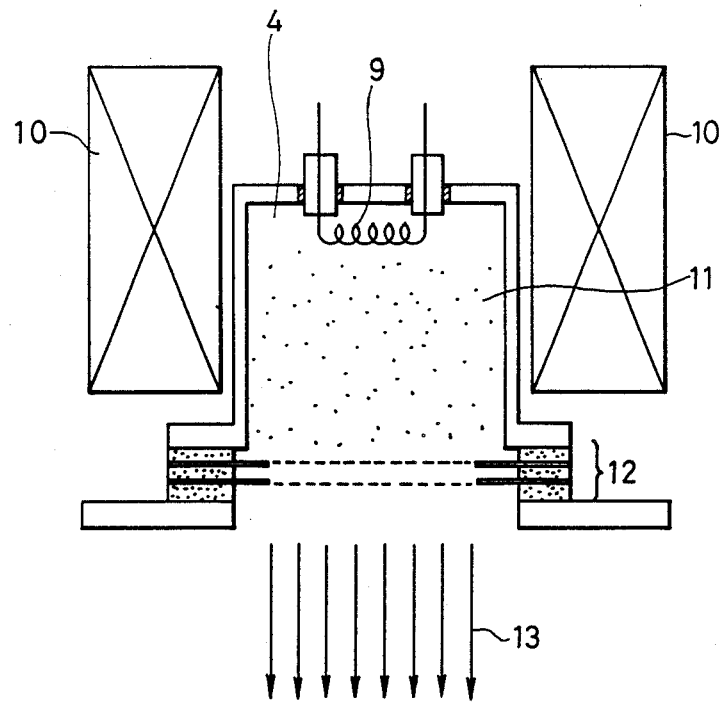
FIG. 3 is a schematic view illustrating a conventional Kaufman type ion source.
Figure 4:
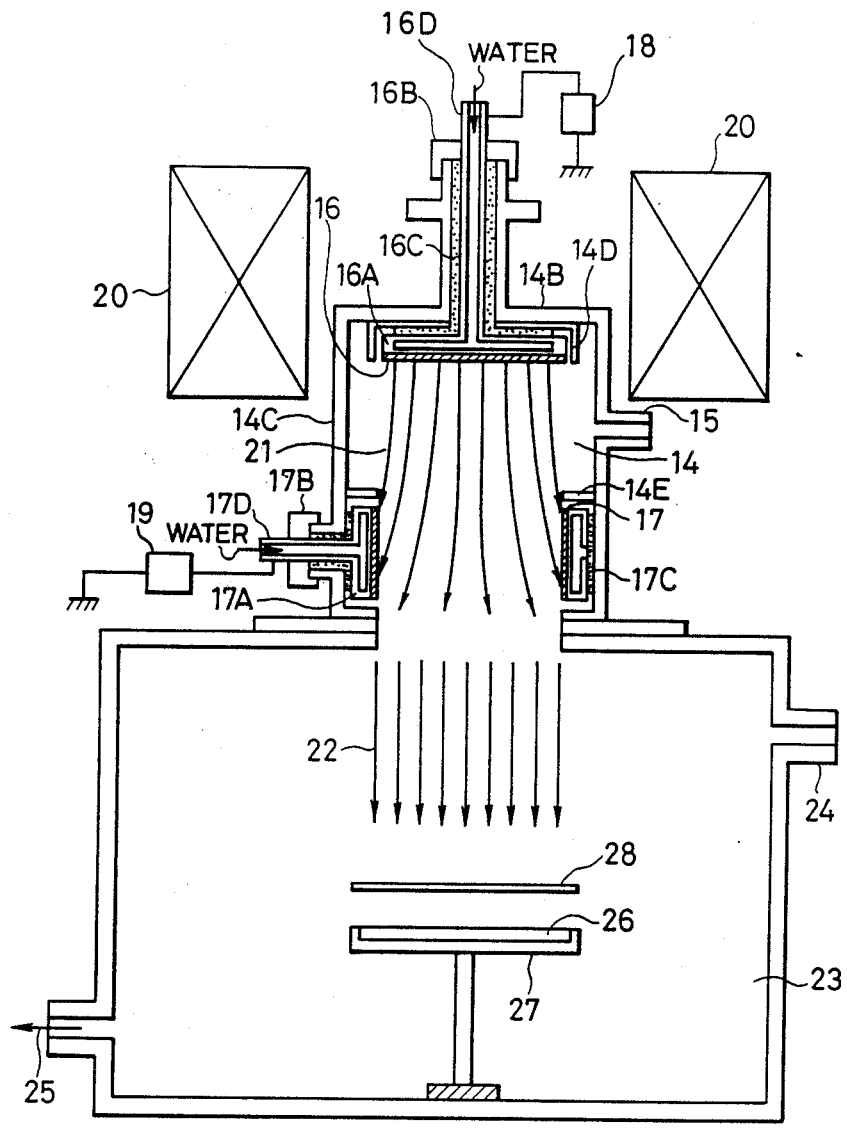
FIG. 4 is a sectional view illustrating a first embodiment of a film forming apparatus in accordance with the present invention.

FIG. 4 is a sectional view illustrating a first embodiment of a thin film forming apparatus in accordance with the present invention. The thin film forming apparatus is a combination of a plasma generating apparatus and a specimen chamber. A gas for generating plasma is introduced through a gas inlet 15 into the plasma generating chamber 14. A target 16 in the form of a flat plate is disposed at a position in the vicinity of the inner surface of the top of the plasma generating chamber 14 while a target 17 in the form of a cylinder is disposed therein at the lower portion thereof. Alternatively, the cross-section of the target 17 may have a polygonal ring shape. Further, the target 17 may be continuous or discontinuous in its circumferential direction. The target 16 is removably mounted on a metal supporting body 16A which is cooled by water and is securely attached to the plasma generating chamber 14 by screwing an internally-threaded cover 16B at the top of the upwardly extended portion of the plasma generating chamber 14; that is, the upper wall 14b thereof. The supporting body 16A is insulated from the wall 14B through an insulating body 16C. In like manner, the cylindrical target 17 is removably mounted on a metal supporting body 17A which is cooled by water and is securely attached to the wall 14C of the plasma generating chamber 14 through an insulating body 17C by screwing on an internally-threaded cover 17B. A projection 16D extended upwardly from the supporting body 16A as well as a projection 17D horizontally extended from the supporting body 17A function as electrodes to which are applied negative voltages from DC power sources 18 and 19, respectively. The negative voltages may be applied from one of the DC power sources 18 and 19 to the targets 16 and 17. At least one electromagnet 20 surrounds the outer surface of the plasma generating chamber 14 so that the magnetic field may be produced therein. Alternatively, the electromagnet 20 may be disposed within the plasma generating chamber 14. The positions of the targets 16 and 17 and the electromagnet 20 are so determined that the magnetic flux 21 produced by the electromagnet 20 traverses the surfaces of the targets 16 and 17 and that the magnetic flux is extended from the surface of one target to the surface of the other target. It is preferable that the plasma generating chamber is so designed and constructed that it may be cooled by water and furthermore that shields 14D and 14E are preferably disposed within the plasma. generating chamber 14 in order to protect the side surfaces of the targets 16 and 17 from plasma The interior of the plasma generating chamber is evacuated to a high vacuum and then a gas is introduced therein through the gas inlet 15. Thereafter, when the negative voltages applied to the targets 16 and 17 are increased, a discharge is effected and plasma is generated in the magnetic field established by the electromagnet 20. Sputtered particles 22 consisting of ions and neutral particles can be extracted from the plasma. The magnetic flux extended between the targets 16 and 17 can prevent the secondary electrons (γ (gamma) electrons) emitted from the surfaces of the targets 16 and 17 from dispersing in the direction perpendicular to the magnetic field and furthermore have the function of confining the plasma. As a result, a high-density plasma is now generated under a low gas pressure. The specimen chamber 23 is communicated with the plasma generating chamber 14. A gas can be introduced into the specimen chamber 23 through a gas inlet 24 and the specimen chamber 23 can be evacuated to a high vacuum by means of an exhaust system 25. A substrate holder 27 for supporting a substrate 26 is disposed within the specimen chamber 23 and a shutter 28 which can be opened or closed is disposed above the substrate holder 27. It is preferable that a heater is incorporated into the substrate holder 27 so as to heat the substrate thereon and furthermore, it is preferable that the specimen chamber 23 is so designed and constructed that AC or DC voltage may be applied to the substrate 26 so that a bias voltage may be applied to the substrate 26 over the surface of which is being grown a thin film and furthermore, it becomes possible to clean the substrate 26 by sputtering.

The factors which influence the generation of plasma are gas pressure in the plasma generation chamber 14, voltages applied to the targets 16 and 17, respectively, the magnetic field distribution, the distance between the targets 16 and 17 and so on.

Figure 5:
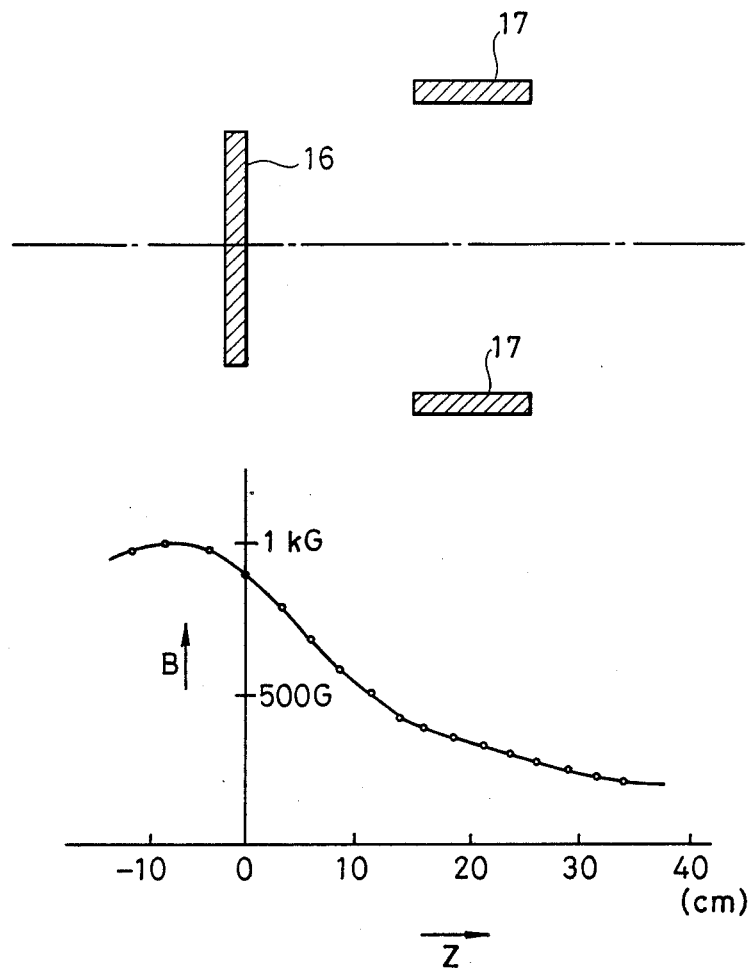
FIG. 5 illustrates the distribution of the strength of the magnetic field in the direction of magnetic fluxes in the embodiment shown in FIG. 4.

FIG. 5 illustrates one example of the distribution of the strength of the magnetic field in the direction of magnetic flux in the film forming apparatus shown in FIG. 4. The magnetic field is a divergent magnetic field.

Figure 6:
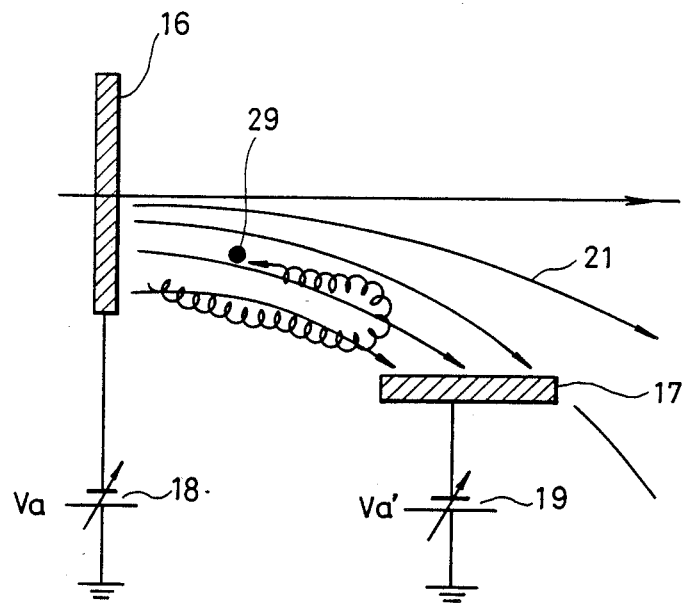
FIG. 6 is a view used to explain the mechanism of generating high-density plasma in a film forming apparatus in accordance with the present invention.

Next, referring to FIG. 6, the underlying principle of the generation of high density plasma in a thin film forming apparatus in accordance with the present invention will be described in detail.

A gas is introduced into the plasma generating chamber and the negative voltages are applied to the targets 16 and 17, respectively, so that the gas is discharged and ionized. When the high-energy ions impinge on the surfaces of the targets 16 and 17 to which are applied a negative voltage Va and a negative voltage Va', respectively, high-energy secondary electrons ($\gamma$ electrons) are emitted from the surfaces of the targets 16 and 17. The $\gamma$ electrons emitted from the surfaces of the targets 16 and 17 are reflected by the electric field established on the targets 16 and 17 and make a reciprocal motion while making a cyclotron motion about the magnetic flux 21 extended between the targets 16 and 17. That is, the electric field established on the targets 16 and 17 acts as a mirror for the $\gamma$ electrons 29. The $\gamma$ electrons 29 are confined between the targets 16 and 17 until the energy of the $\gamma$ electrons becomes lower than the electron confining energy of the magnetic flux, and during the confinement of the $\gamma$ electrons, the ionization is accelerated mainly due to the collision of the electrons with the neutral particles. Furthermore, the high-energy electron beam reciprocating between the targets 16 and 17 interacts with the plasma, so that the ionization of the neutral particles is further accelerated. Hence, a high-density plasma can be generated in a low pressure gas.

The neutral particles reach the surface of the substrate without being adversely influenced by the electric and magnetic field. The electrons which have lost their energies reach the surface of the substrate along the diverging magnetic field so that the surface of the substrate has a negative potential. As a result, ions as well as neutral particles are deposited over the surface of the substrate.

In the apparatus according to the present invention, the discharge can be effected in a stable manner at a low gas pressure of the order of $10^{-5}$ Torr and furthermore can realize the formation of a thin film having better crystal structures over the low temperature substrate at a high-rate in a relatively high pressure gas in which neutral radicals play an important role in the growth of the thin film.

Figure 7:
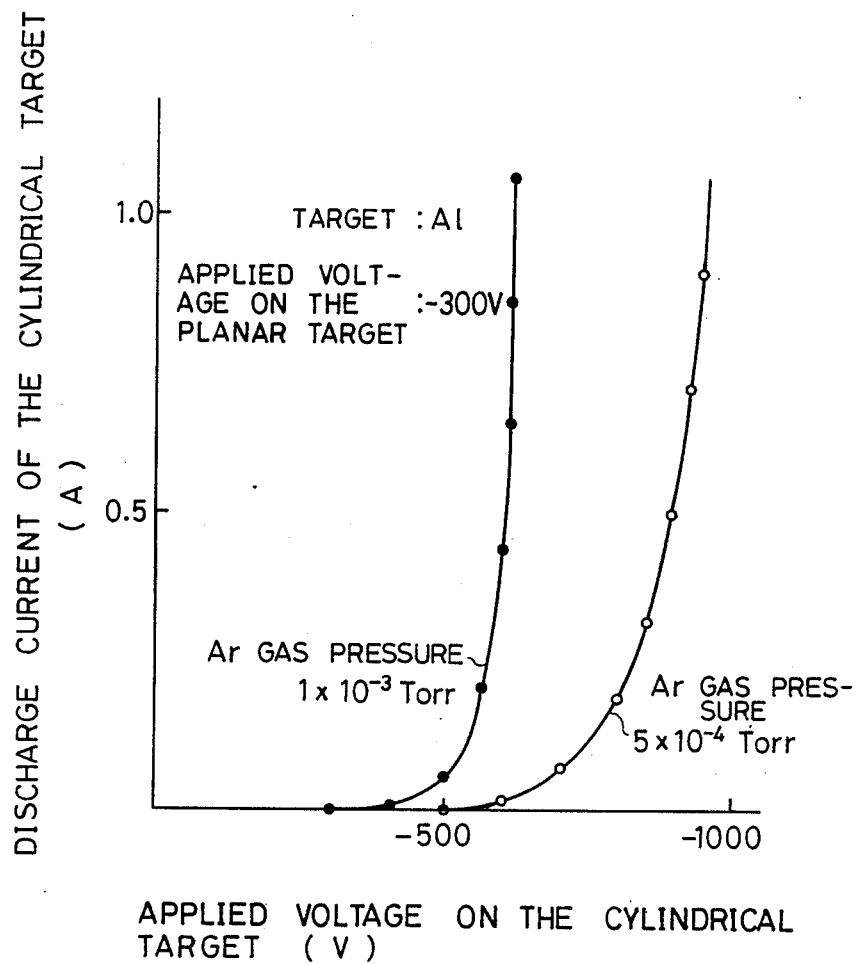
FIG. 7 illustrates one example of discharge characteristics when a target is made of aluminum in a film forming apparatus in accordance with the present invention.

Next, the results of the formation of an Al film by the apparatus in accordance with the present invention will be described. After the specimen chamber was evacuated to a vacuum of $5 \times 10^{-7}$ Torr, in a first example, Ar gas was introduced at a flow rate of 2.5 cc per minute, and within the plasma generating chamber 14, a discharge was effected at a gas pressure of $5 \times 10^{-4}$ Torr. And in a second example, Ar gas was introduced at a flow rate of 5 cc per minute and a discharge was effected at a gas pressure of $1 \times 10^{-3}$ Torr. FIG. 7 illustrates the discharge characteristics obtained from the above-described experiments in which the voltage applied to the planar target 16 was maintained at $-300$ V. Each experiment showed constant voltage discharge characteristics wherein the discharge current increases in an avalanche manner from a certain voltage. With the film forming apparatus in accordance with the present invention, even when the negative voltages applied to the planar target 16 and the cylindrical target 17 are the same, sufficiently high-density plasma can be generated. The power supplied to the cylindrical Al target 17 was between 300 and 600 W and the thin film growth was carried out without heating the substrate holder, that is, the temperature of the substrate is room temperature.

The result is that the Al films could be deposited at a stable manner at a deposition rate within a range between 10 and 100 nm/min for a long period of time.

Figure 8:
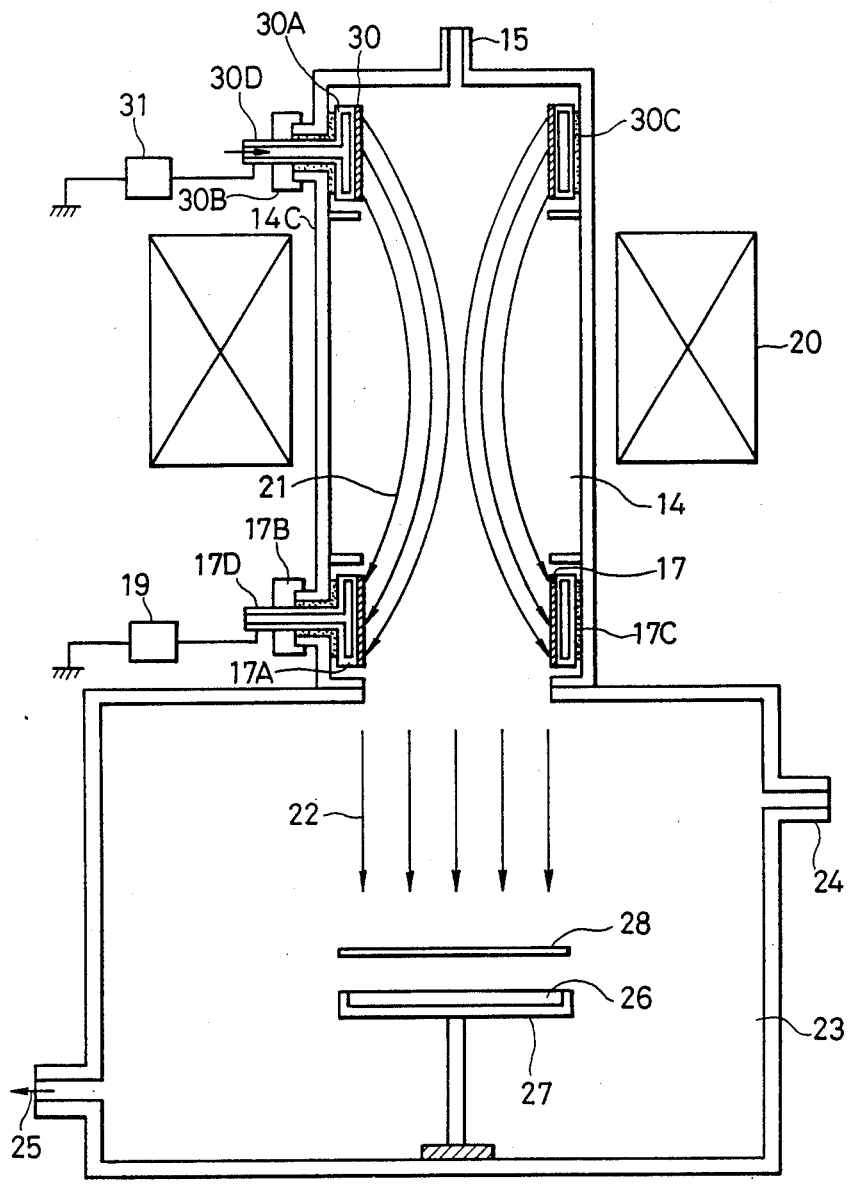
FIG. 8 is a sectional view illustrating a second embodiment of a film forming apparatus in accordance with the present invention.

FIG. 8 illustrates a second embodiment of a film forming apparatus in accordance with the present invention which is different from the embodiment described above with reference to FIG. 4 in that the sputtering targets are two cylindrical targets 17 and 30. The target 30 is removably secured to a metal supporting body 30A which can be cooled by water and which is securely attached to the wall 14C by an internally-threaded cover 30B in such a way that the target supporting body 30A, is insulated from the wall 14C through an insulating body 30C. A projection 30D extended horizontally from the supporting body 30 is used as an electrode to which is applied a negative voltage supplied from a power source 31. The magnetic flux 21 produced by the electromagnet 20 leaves the surface of one target and enters the surface of the other target.

Figure 9:
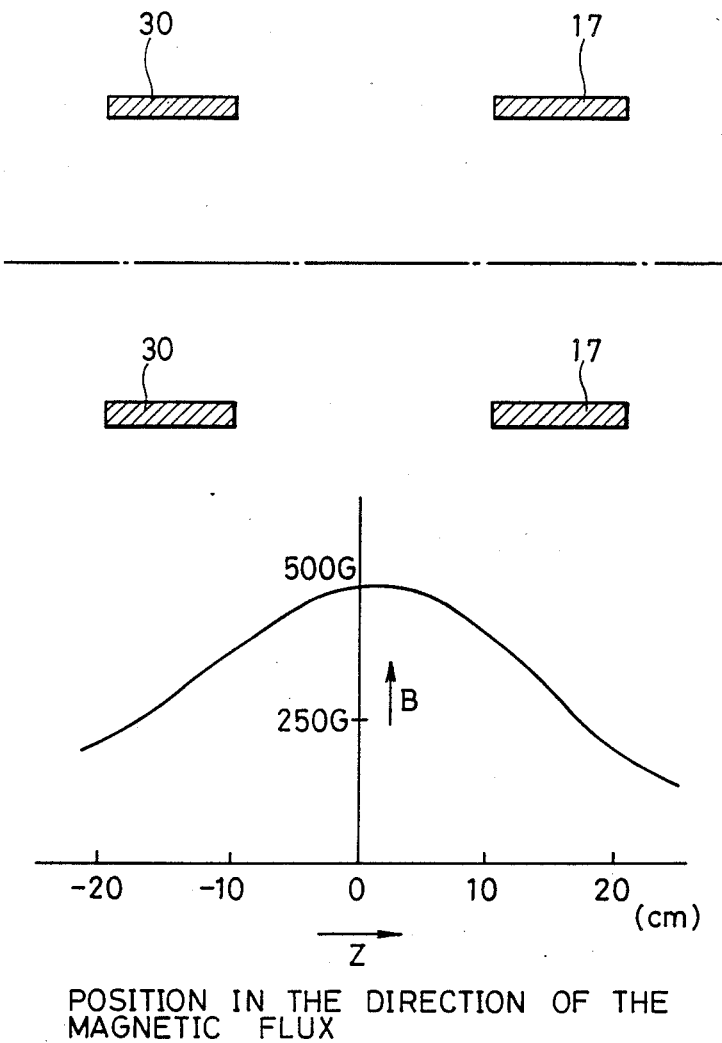
FIG. 9 illustrates the distribution of the strength of the magnetic field in the direction of magnetic flux in the embodiment shown in FIG. 8.

FIG. 9 illustrates an example of the distribution of the strength of magnetic field in the direction of magnetic flux in the embodiment shown in FIG. 8.

Figure 10:
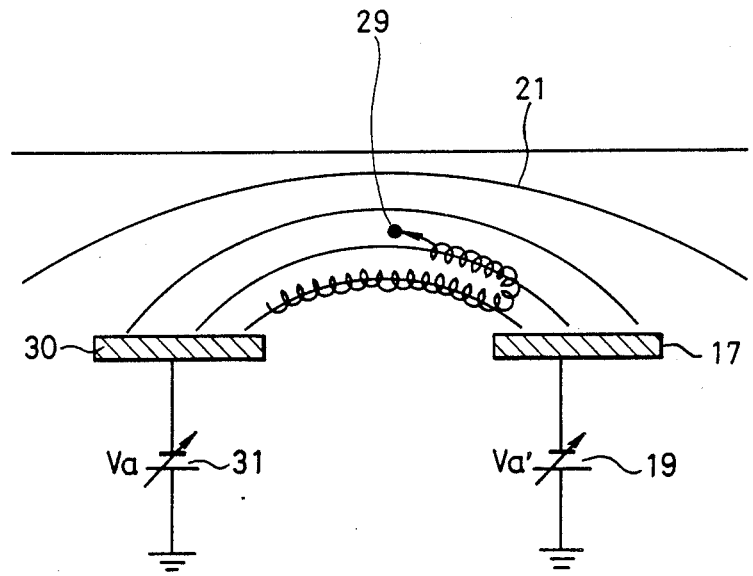
FIG. 10 is a view used to explain the mechanism of generating high-density plasma in the embodiment shown in FIG. 8.

As shown in FIG. 10, like the above-described embodiment, according to this embodiment, when the high-energy ions impinge upon the surfaces of targets to which are applied negative voltages Va and Va', respectively, the high-energy secondary electrons ($\gamma$ electrons) 29 are emitted from the surfaces of the targets and are reflected by the electric field established on the targets so that the $\gamma$ electrons make a reciprocal motion between the targets while making a cyclotron motion around the magnetic flux 21. The second embodiment can generate high-density plasma even at a low gas pressure in a manner substantially similar to that described above.

Next, the results of the formation of Al films by this embodiment will be described hereinafter. After the specimen chamber 23 was evacuated to a vacuum of $5 \times 10^{-7}$ Torr, Ar gas was introduced into the specimen chamber 23 at a flow rate of 5 cc/min and a discharge was effected in the plasma generating chamber in which the gas pressure was maintained at $5 \times 10^{-5}$ Torr, and Ar gas was introduced at a flow rate of 1 cc/min and a discharge was effected at a gas pressure of $0.8 \times 10^{-3}$ Torr. The discharge characteristics obtained are substantially similar to those shown in FIG. 7.

Figure 11:
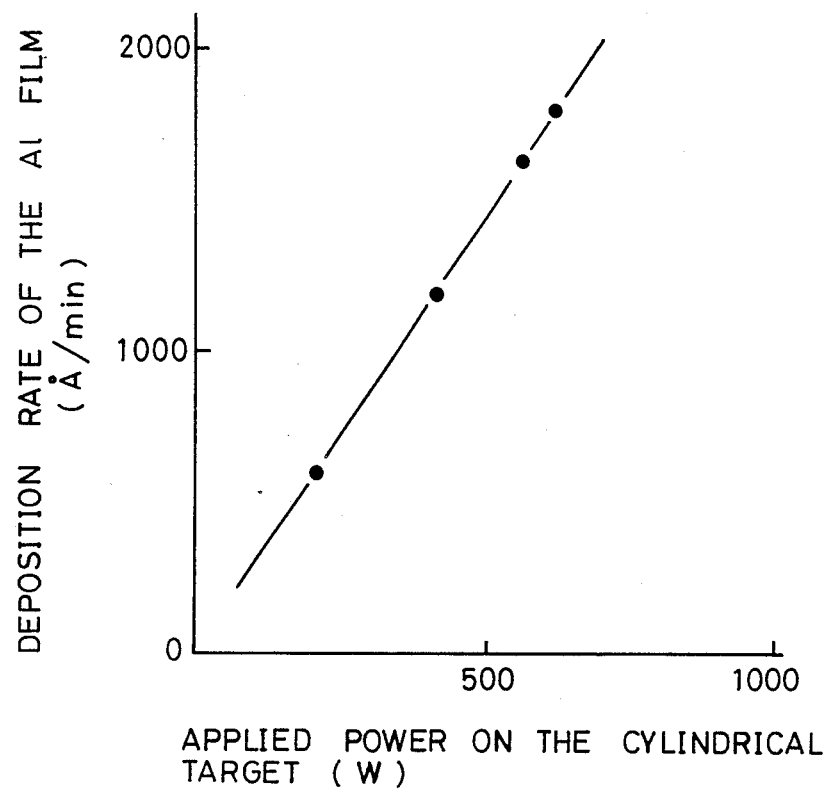
FIG. 11 illustrates one example of the dependence of the thin film deposition rate on power applied to a target.

While the power between 200 and 600 W was applied to the cylindrical Al targets 17 and 30, the Al films were grown over the surfaces of the substrates at room temperature at a deposition rate between 600–1800 Å/min in a stable and efficient manner for a long period of time even when the substrate holder was not heated. As shown in FIG. 11, the deposition rate increases linearly with the increase in power applied to the targets.

Figure 12:
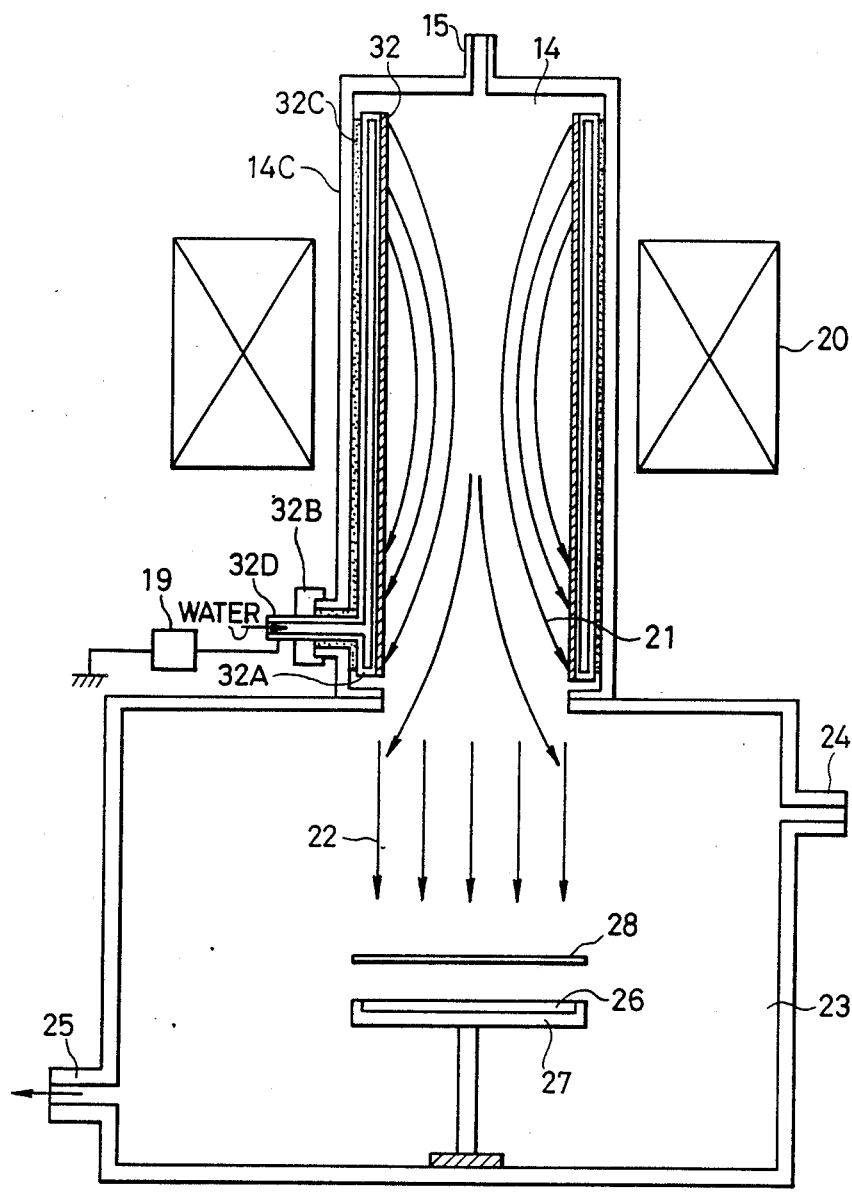
FIGS. 12–15 are sectional views illustrating a third, a fourth, a fifth and a sixth embodiment, respectively, of a film forming apparatus in accordance with the present invention.

FIG. 12 illustrates a third embodiment of the present invention in which only one cylindrical target 32 is used. The target 32 is removably secured to a metal supporting body 32A which can be water cooled and is securely attached to the wall 14C with an internally-threaded cover 32B in such a way that it is insulated from the wall 14C by an insulating member 32C. A projection 32D horizontally extended from the supporting body 32A acts as an electrode to which is applied a negative voltage supplied from the power supply 19. The magnetic flux induced by the electromagnet 20 leaves the surface at one end of the cylindrical target 22 and enters the surface at the other end thereof. The mode of operation of the third embodiment with the above-described construction is substantially similar to that of the embodiment described above with reference to FIG. 8.

Figure 13:
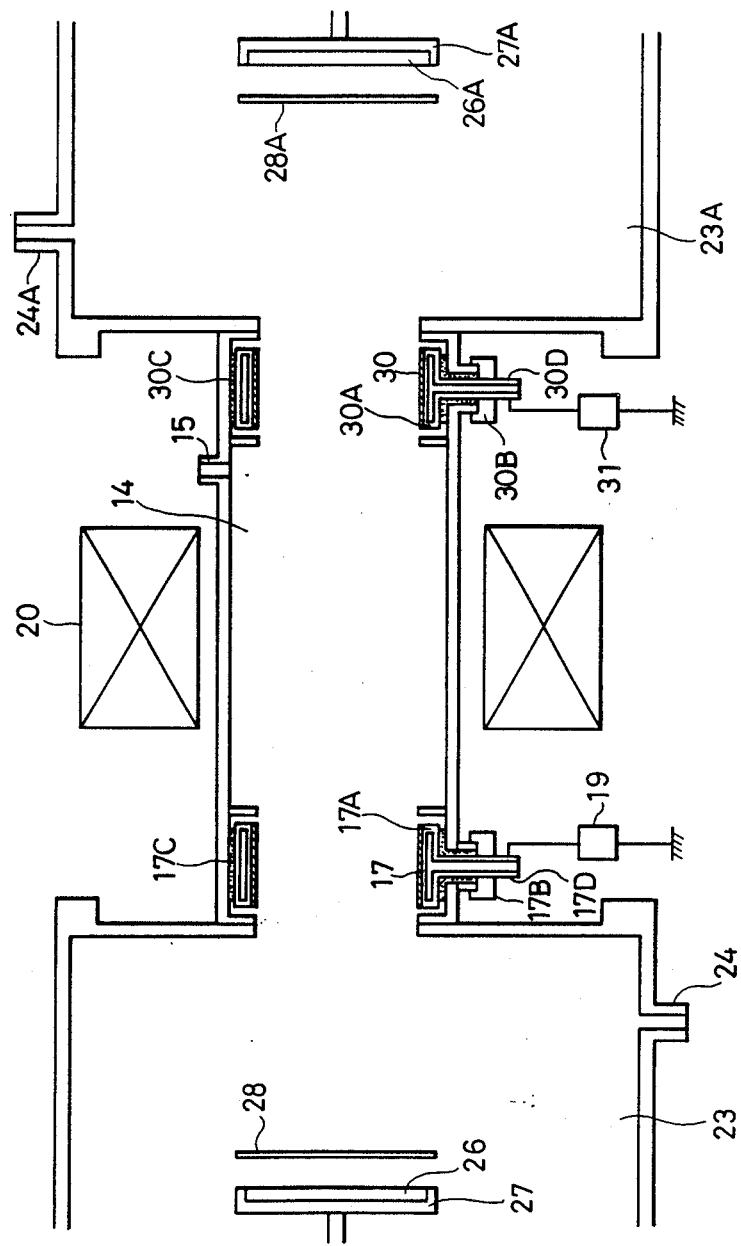

FIG. 13 illustrates a sectional view of a fourth embodiment of a film forming apparatus in accordance with the present invention. In this embodiment, both ends of the plasma generating chamber 14 are communicated with specimen chambers 23 and 23A, respectively, so that sputtered particles can be extracted from both ends of the plasma generating chamber 14. The specimen chamber 23A is provided with a gas inlet 24A and an exhaust system (not shown) and a specimen holder 27A and a shutter 28A are disposed within the specimen chamber 23A. The specimen holder 27A is substantially similar in construction to the specimen holder 27. With the fourth embodiment with the above-described construction, thin films can be grown simultaneously over the surfaces of the substrates 26 and 26A mounted on the holders 27 and 27A, respectively.

In the above-described embodiments, the maximum value of the magnetic field established in the plasma generating chamber may be of the order of 100 G, which is sufficient in practice.

Figure 14:
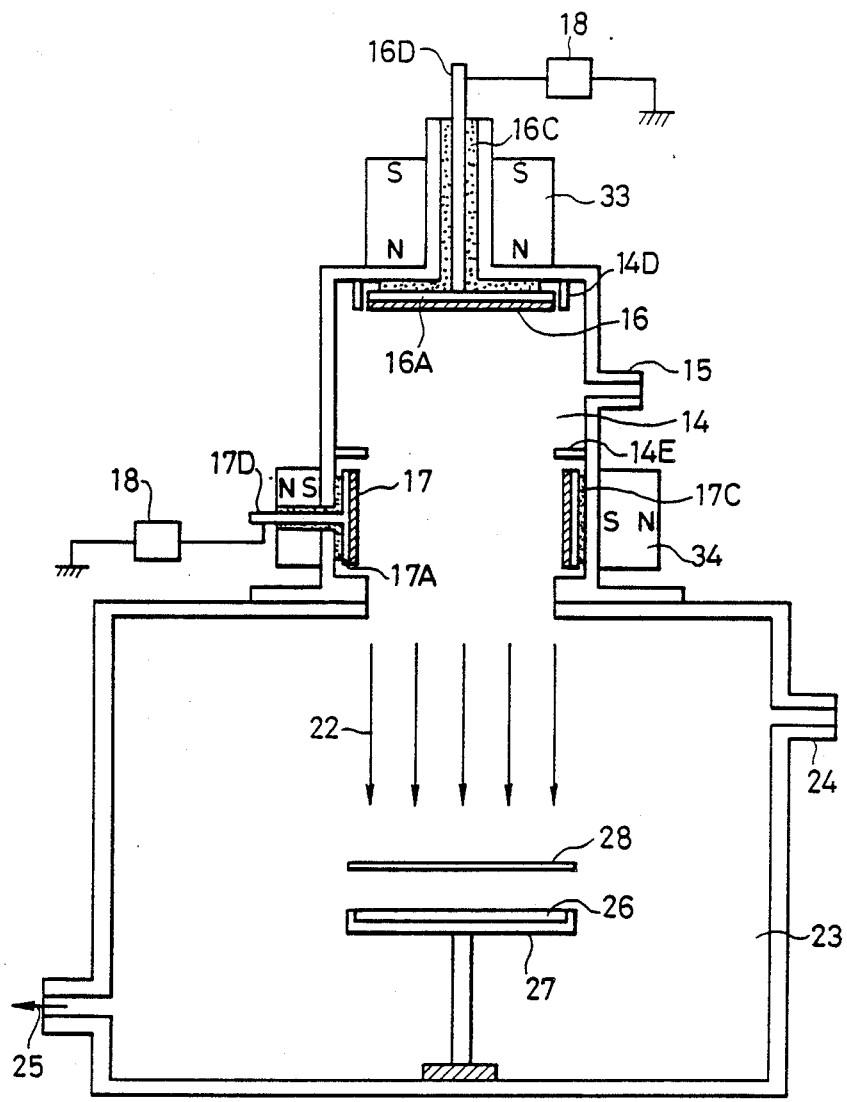

Instead of the electromagnet 20, a permanent magnet may be used as will be described in detail hereinafter. FIG. 14 illustrates a fifth embodiment of a film forming apparatus in accordance with the present invention in which instead of the electromagnet 20 shown in FIG. 4, two ring-shaped permanent magnets 33 and 34 are used. Alternatively, permanent magnets 33 and 34 are composed of a plurality of radially arranged bar-shaped magnets respectively. By producing the magnetic flux leaving the surface of one of the targets 16 and 17 and entering the surface of the other target, it becomes possible to generate high-density plasma and to extract plasma particles, thereby forming a thin film at a high deposition rate as in the case of the embodiment described above with reference to FIG. 4.

Figure 15:
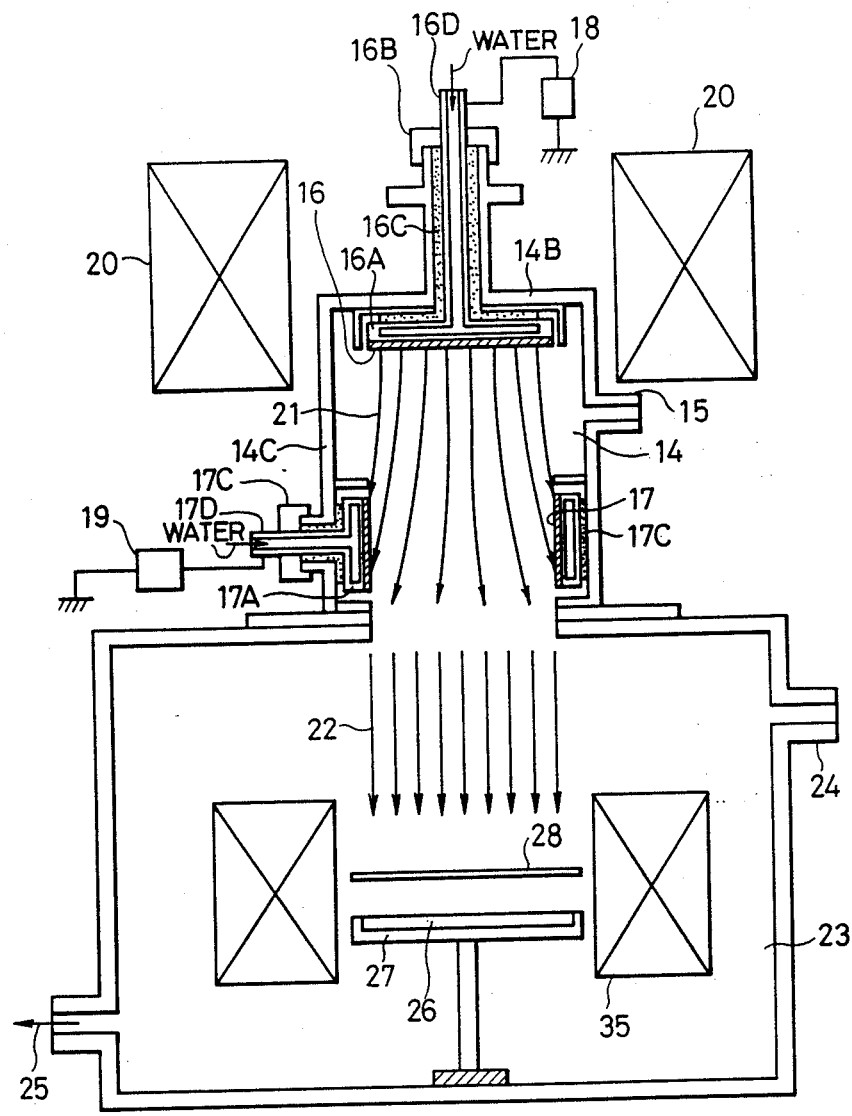

FIG. 15 illustrates a sixth embodiment of the present invention which is substantially similar in construction to the embodiment described above with reference to FIG. 4 except that, in addition to the electromagnet 20, an auxiliary electromagnet 35 is disposed in the specimen chamber 23 so as to control the magnetic flux induced by the electromagnet 20. Alternatively, the auxiliary electromagnet 35 may be disposed around the outer wall of the specimen chamber 23. The magnetic flux induced by the auxiliary magnet is in the same or opposite direction of the magnetic flux induced by the electromagnet 20. The magnetic flux 21, which is induced by the electromagnet 20 to enter the surface of the cylindrical target 17, can be controlled by controlling the direction and the strength of the magnetic field induced by the auxiliary magnet 35, and accordingly the distribution of the erosion of the cylindrical target 17 can be controlled.

Figure 16:
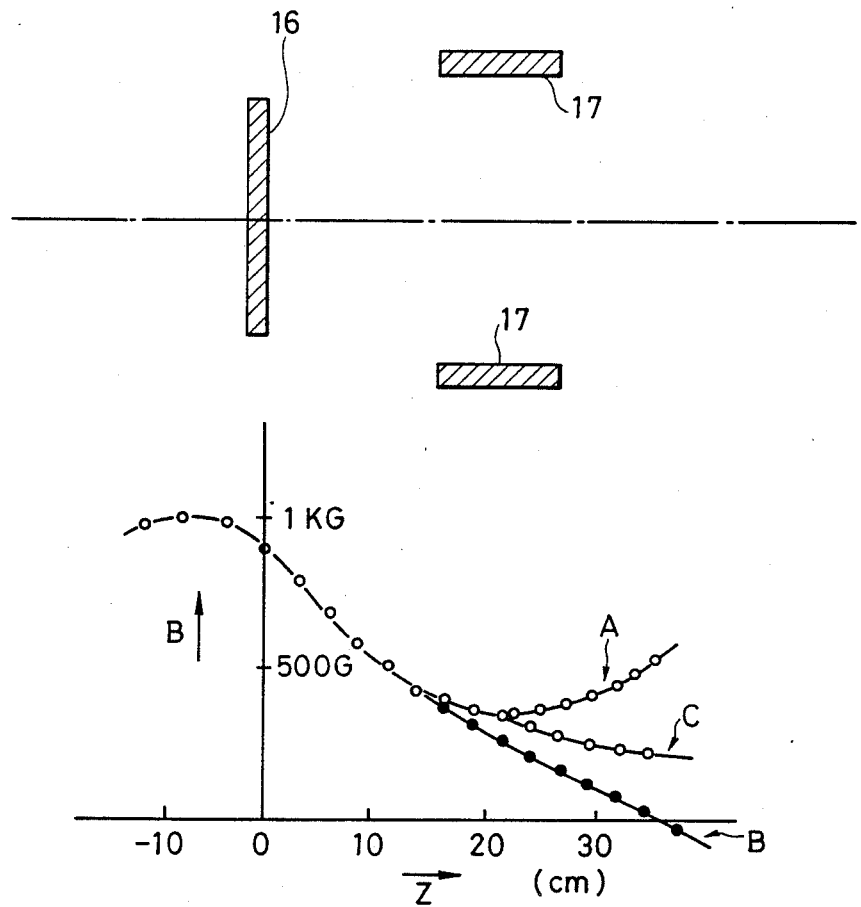
FIG. 16 illustrates the distribution of the strength of the magnetic field in the direction of magnetic flux in the embodiment shown in FIG. 15.

FIG. 16 illustrates the distribution of the strength of magnetic field in the direction of the magnetic flux in the embodiment shown in FIG. 15. Curves A and B show distributions when the directions of the magnetic flux opposite direction of the magnetic flux induced by the electromagnet 20, respectively. While curve C shows a distribution when the magnetic flux is not induced by the auxiliary magnet.

The sixth embodiment can not only effect the stabilized discharge at a low gas pressure of the order of $10^{-5}$ Torr, but also realize the growth of a thin film having better crystallographic characteristics over the low temperature substrate at a high deposition rate even in a relatively high pressure gas in which neutral radicals play an important role in the growth of a thin film in a manner substantially similar to that in the embodiments described above.

Next, the results of the experiments for forming Al thin films by the embodiment shown in FIG. 16 will be described hereinafter. After the specimen chamber 23 was evacuated to a vacuum of $5 \times 10^{-7}$ Torr, Ar gas was introduced into the plasma generating chamber 14 at flow rates of 2.5 cc/min and 5 cc/min in respective experiments and discharged at a gas pressure of $5 \times 10^{-4}$ Torr and $1 \times 10^{-3}$ Torr in respective experiments. The discharge characteristics thus obtained are substantially similar to those shown in FIG. 7.

Thin films were grown while the power applied to the cylindrical aluminum target 17 was between 30 and 600 W, at room temperature without heating the substrate holder. The thin films could be grown at a deposition rate ranging from 10 to 100 nm/min for a long period of time in a stabilized and efficient manner. The dependence of the deposition rate on the applied power is similar to that shown in FIG. 11.

Figure 17:
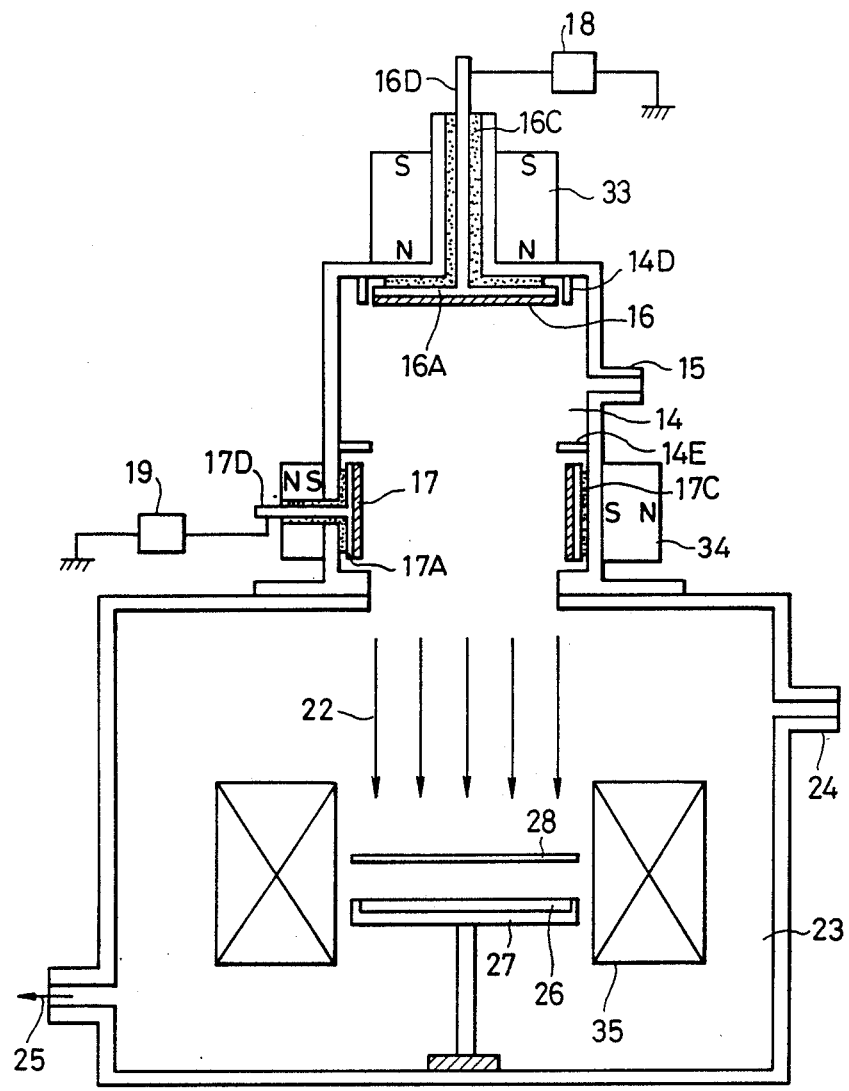
FIG. 17 is a sectional view illustrating a seventh embodiment of a film forming apparatus in accordance with the present invention.

FIG. 17 illustrates a seventh embodiment of a film forming apparatus in accordance with the present invention which is substantially similar in construction to the embodiment described above with reference to FIG. 14 except that in addition to the permanent magnets 34, an auxiliary electromagnet 35 is disposed, for instance, within the specimen chamber 23. The mode of operation of the seventh embodiment with the construction described just above is substantially similar to that of the sixth embodiment described above with reference to FIG. 15. The auxiliary electromagnet may be applied to all the embodiments of the present invention and furthermore it is to be understood that instead of the auxiliary electromagnet, auxiliary permanent magnets may be also used.

The thin film forming apparatuses in accordance with the present invention can be used to form not only aluminum films but also thin films of almost all kinds of materials. In addition, almost all kinds of reactive gases may be used and introduced into the plasma generating chamber so that the reactive sputtering process can be carried out.

Next, an ion source in accordance with the present invention and a thin film forming apparatus incorporating therein the ion source will be described.

Figure 18:
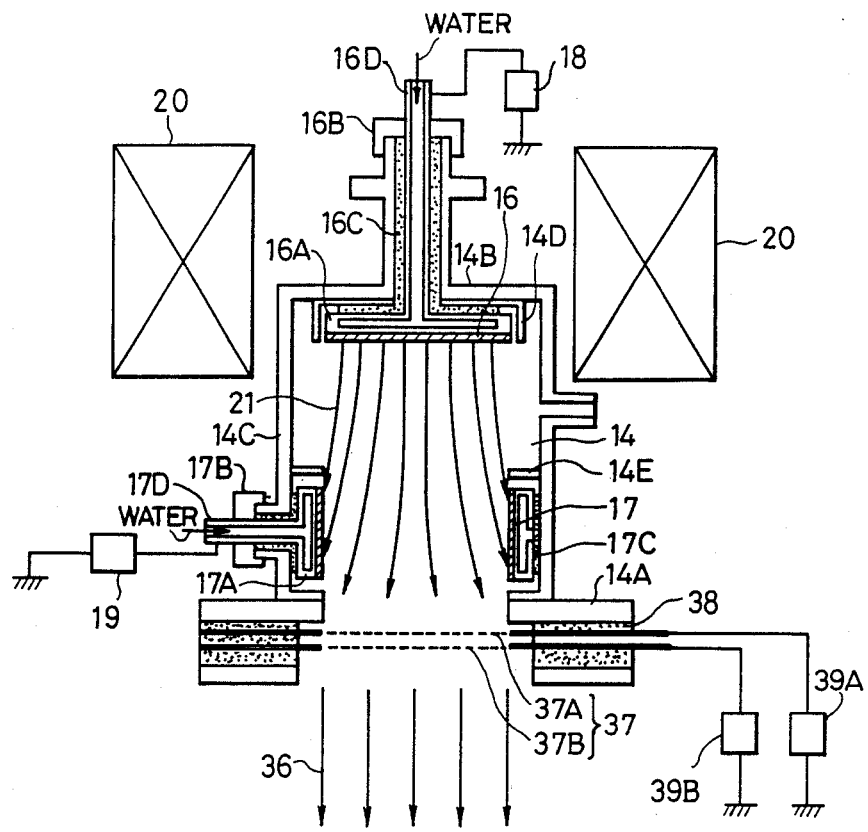
FIG. 18 is a sectional view of a first embodiment of an ion source in accordance with the present invention.

FIG. 18 is a sectional view illustrating a first embodiment of an ion source in accordance with the present invention in which grids 37 for extracting the ion beams 36 are disposed at the lower portion of the plasma generating chamber 14 of the embodiment described above with reference to FIG. 4. In this embodiment, two perforated grids 37A and 37B are used and attached to the wall 14A which defines the bottom of the plasma generating chamber 14 in such a way that they are electrically insulated from each other by electrical insulating members 38. Negative voltages are applied from power sources 39A and 39B to the grids 37A and 37B, respectively. It is preferable to apply a positive potential to the plasma generating chamber 14. When a voltage ranging from minus tens to $-200$ V is applied to the grid 37A on the side of the plasma generating chamber 14 with respect to the latter, an effect wherein the ions accelerated by the grids remove a thin film deposited over the surface of the grids can be attained.

Figure 19:
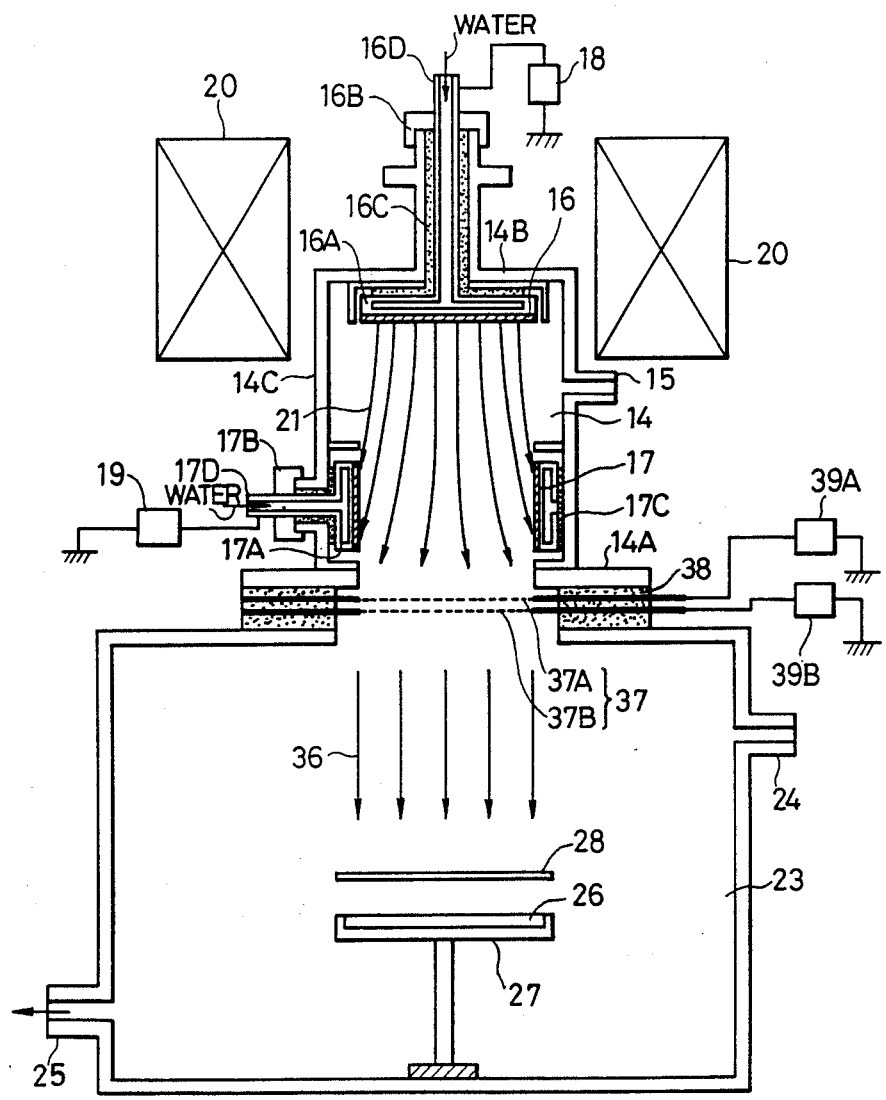
FIG. 19 is a sectional view of a film forming apparatus to which is applied the ion source shown in FIG. 18.

FIG. 19 is a sectional view of a thin film forming apparatus utilizing the ion source described above with reference to FIG. 18.

The ion extracting grids 37 are interposed between the plasma generating chamber 14 and the specimen chamber 23. The film forming apparatus shown in FIG. 19 is substantially similar in construction to the embodiment described above with reference to FIG. 4 except for the ion extracting mechanism, but it is a preferable that the plasma generating chamber 14 and the specimen chamber 23 are electrically insulated from each other.

In the embodiment shown in FIG. 19, the magnetic field strength distribution in the direction of magnetic flux is substantially similar to that shown in FIG. 5.

In the embodiment shown in FIG. 19, high-density plasma can be generated based on the underlying principle of the present invention described above with reference to FIG. 6. The ions in the plasma are accelerated by the voltages applied to the ion extracting grids and enter the specimen chamber 23 in which the ions are deposited over the surface of the substrate 26. The energy of the extracted ions can be controlled by an acceleration voltage which is a difference voltage between the voltages applied to the plasma generating chamber 14 and the ion extracting grids 37.

Figure 20:
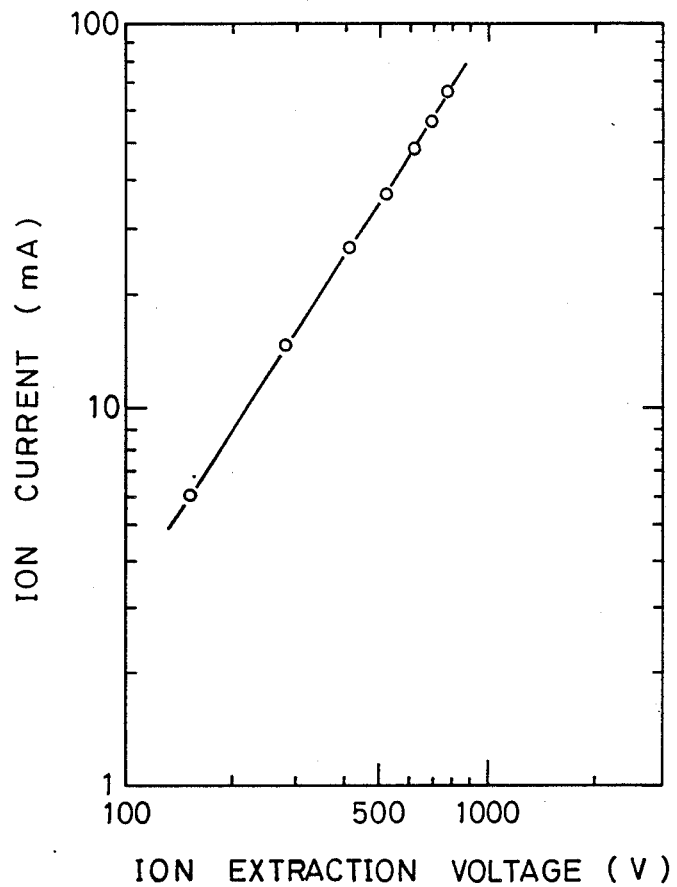
FIG. 20 illustrates one example of the ion extraction characteristics.

Next, the results of the experiments conducted by utilizing the embodiment of the ion source described above to extract aluminum ions to form Al thin films will be described hereinafter. After the specimen chamber 23 was evacuated to a vacuum of $5 \times 10^{-7}$ Torr, Ar gas was introduced into the plasma generating chamber 14 at flow rates of 2.5 cc/min and 5 cc/min in respective experiments, and discharges are effected in the plasma generating chamber 14 at gas pressures of $5 \times 10^{-4}$ Torr and $1 \times 10^{-3}$ Torr in respective experiments, The discharge characteristics thus obtained are substantially similar to those shown in FIG. 7. Sputtering was carried out by varying the power applied to the Al target 17 between 300 and 600 W. The ion extracting characteristic is illustrated in FIG. 20 in which the extracting voltage plotted along the abscissa is a relative voltage difference between the plasma generating chamber 14 and the grid 37A. When the energy of extracted ions was maintained at 300 eV, the growth of a thin film over the surface of the substrate which was maintained at room temperature was carried out. The result is that the Al thin film could be grown at a deposition rate of 1-10 nm/min for a long period of time in a stable and efficient manner.

Figure 21:
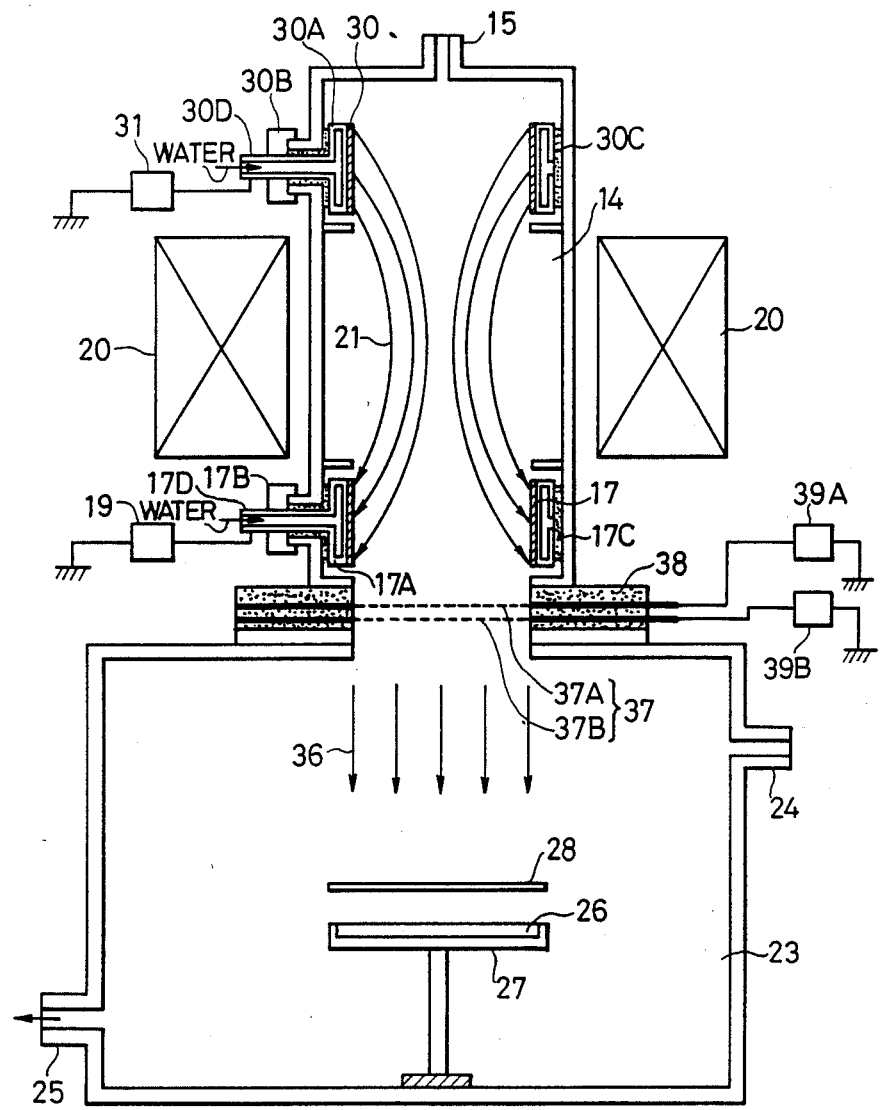
FIG. 21 is a sectional view of a film forming apparatus to which is applied a second embodiment of an ion source in accordance with the present invention.

FIG. 21 is a sectional view illustrating a thin film forming apparatus incorporating therein a second embodiment of an ion source in accordance with the present invention.

This embodiment is different from the embodiment shown in FIG. 18 in that the targets to be sputtered are two cylindrical targets 17 and 30. The target 30 is removably secured to the metal supporting body 30A which can be water-cooled and which in turn is attached to the wall 14C by the internally-threaded cover 30B. The supporting body 30A is electrically insulated from the wall 14C by the insulating body 30C. The projection 30D of the supporting body 30A acts as an electrode connected to a power supply 31 so that a negative voltage with respect to the plasma generating chamber 14 is applied to the target 30. The magnetic flux induced by the electromagnet 20 leaves the surface of one of the targets 17 and 30 and enters the surface of the other target.

The distribution of the strength of magnetic field in the direction of the magnetic flux is substantially similar to that shown in FIG. 9 and the magnetic field is a diverging magnetic field.

Experiments were conducted to form thin aluminum films by utilizing the sputtering type ion source shown in FIG. 21. The discharge characteristics are substantially similar to hose shown in FIG. 7.

Figure 22:
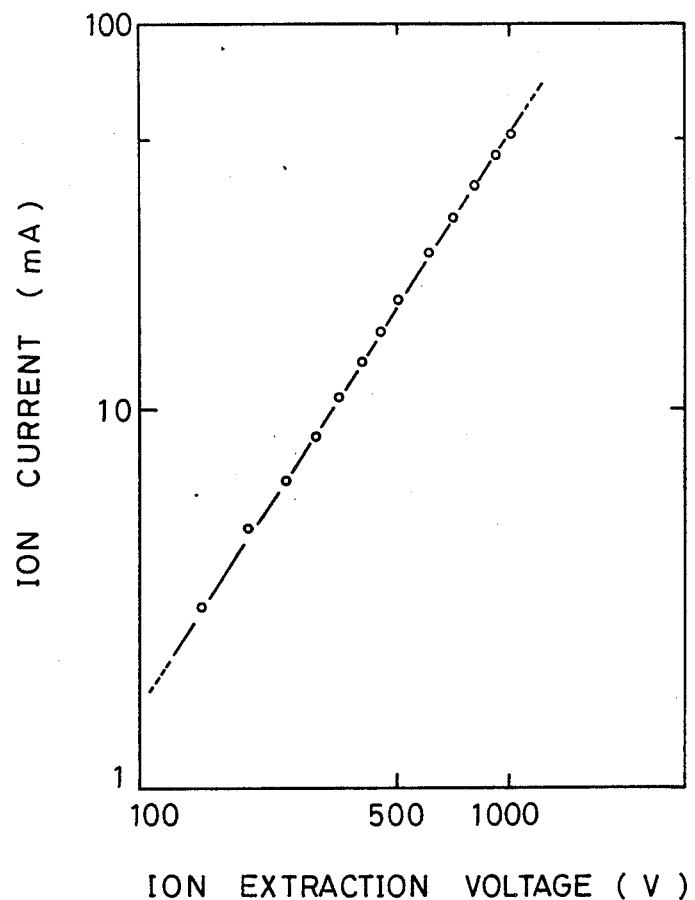
FIG. 22 illustrates one example of ion extraction characteristics.

FIG. 22 illustrate an example of the aluminum ion extracting characteristic. Sputtering was carried out by varying the power applied to the cylindrical aluminum targets 17 and 30 between 300 and 600 W. Under the conditions that the energy of the extracted ions was maintained at 300 eV and the substrate holder was not heated, the film was grown over the substrate at room temperature. The result is that the aluminum thin films were deposited at a deposition rate ranging from 1 to 10 nm/min continuously for a long period of time in a stable and efficient manner.

Figure 23:
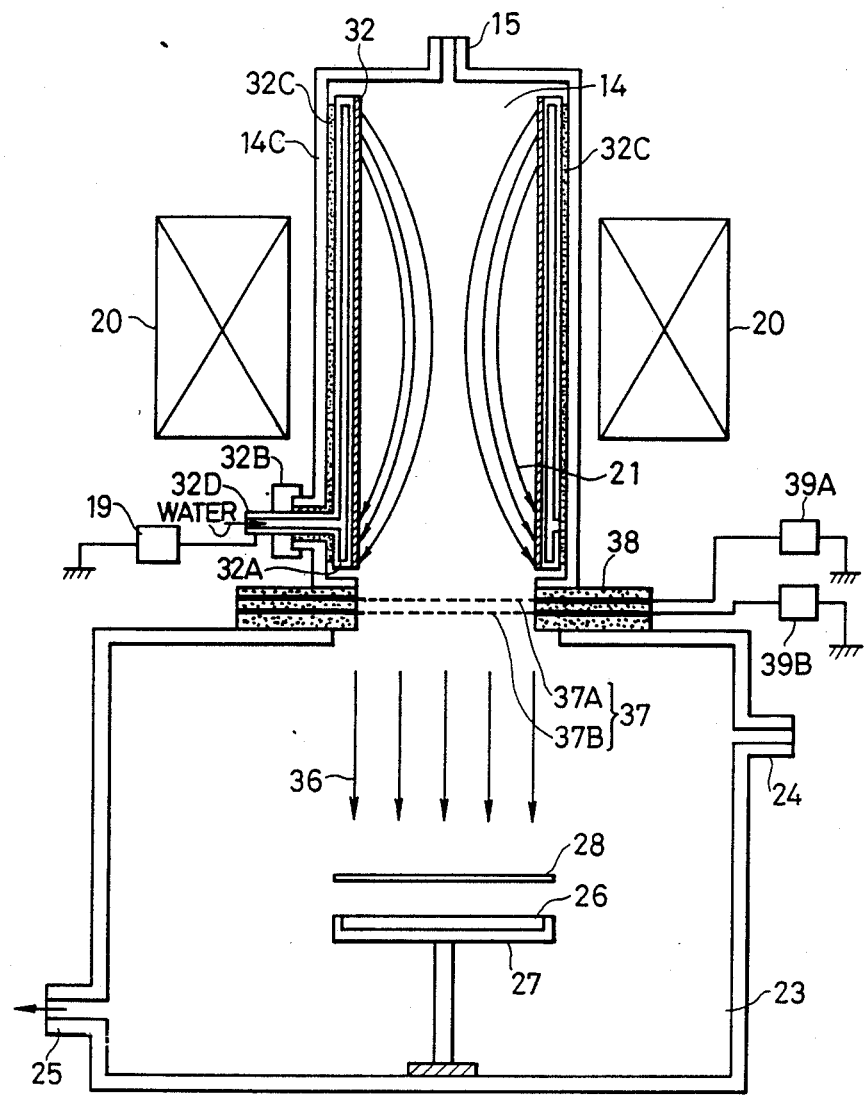
FIGS. 23 is a sectional view illustrating a film forming apparatuses to which is applied a third embodiment of an ion source in accordance with the present invention.

FIG. 23 illustrates a film forming apparatus utilizing a third embodiment of an ion source according to the present invention in which the target to be sputtered is a single cylindrical target 32 which can be installed in a manner substantially similar to that described above with reference to FIG. 12. Furthermore, the magnetic flux leaving the surface of one end of the target 32 and entering the surface of the other end thereof is also similar to that described with reference to FIG. 12.

The mode of operation of the ion source in this embodiment is substantially similar to that described above with reference to FIG. 21.

Figure 24:
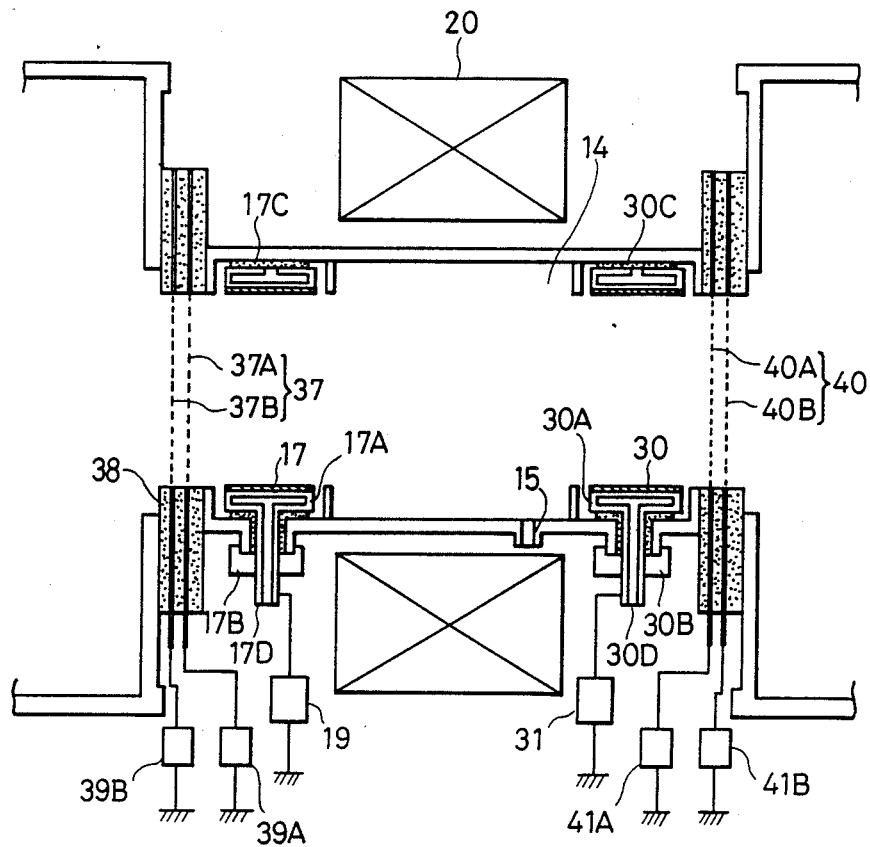
FIG. 24 is a sectional view illustrating a fourth embodiment of an ion source in accordance with the present invention.

FIG. 24 illustrated a fourth embodiment of an ion source in accordance with the present invention in which ion extracting grids 37 and 40 are disposed at both ends of the ion source shown in FIG. 21 so that ion beams can be extracted from both ends of the ion source. The ion extracting grids 40 are composed of perforated grids 40A and 40B to which negative voltages are applied, respectively, from power sources 41A and 41B.

In the above-described embodiments, it suffices that the maximum value of the magnetic field induced in the plasma generating chamber by the electromagnet 20 is of the order of 100 G.

It is to be noted that instead of the electromagnet 20, permanent magnets may be also used as described below.

Figure 25:
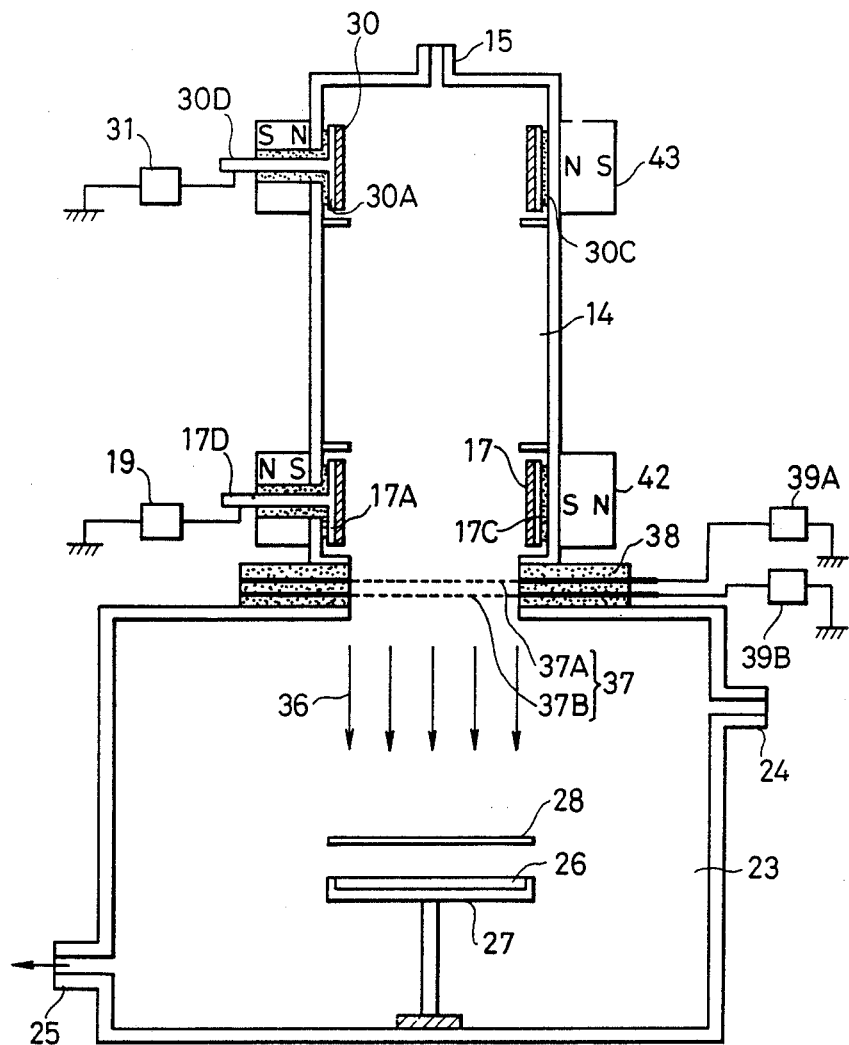
FIG. 25 is a sectional view illustrating a film forming apparatus to which is applied a fifth embodiment of an ion source in accordance with the present invention.

FIG. 25 is a sectional view of a film forming apparatus in accordance with fifth embodiment of an ion source in which instead of the electromagnet 20 shown in FIG. 21, two permanent magnets 42 and 43 are used. By inducing the magnetic flux leaving the surface of one of the targets 17 and 30 and entering the surface of the other target, high-density plasma can be generated, so that this ion source can be used as a high-current ion source as in the case of the embodiment shown in FIG. 21. In the embodiments shown in FIGS. 19, 23 and 24, respectively, the electromagnet can be replaced by permanent magnets.

Next, a further improved ion source with a high ion extraction efficiency and a thin film forming apparatus incorporating the above-described ion source will be described.

Figure 26:
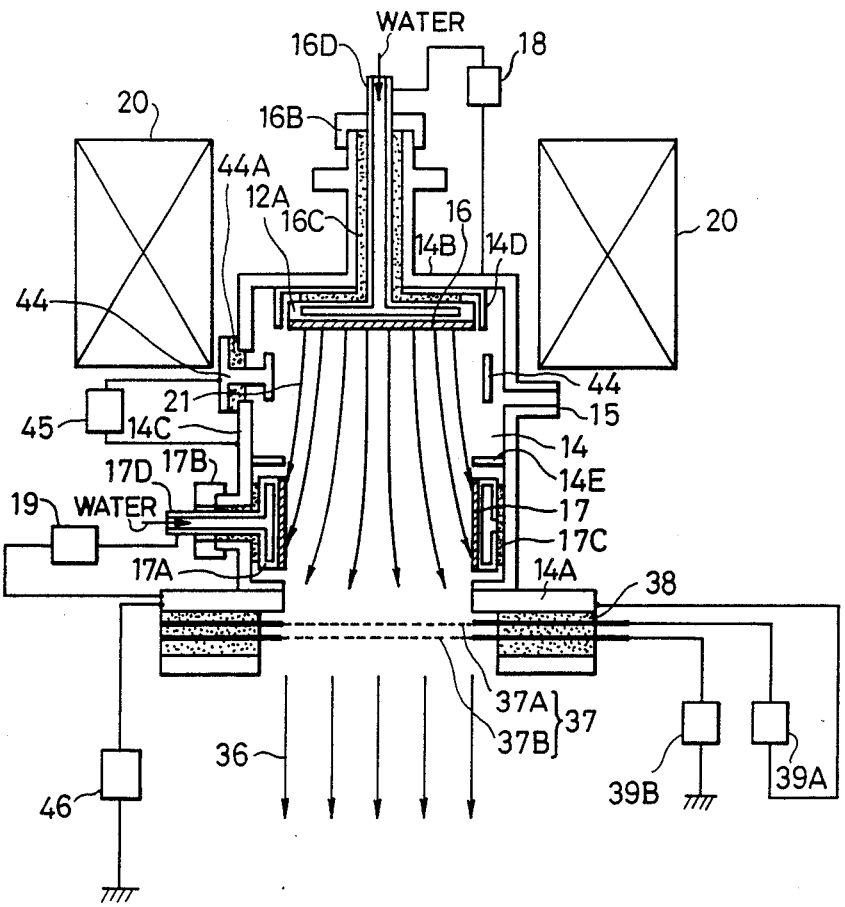
FIG. 26 is a sectional view of a sixth embodiment of a sputtering type ion source in accordance with the present invention.

FIG. 26 is a sectional view illustrating a sixth embodiment of an ion source whose ion extraction efficiency is improved. Within the plasma generating chamber 14, a cylindrical anode 44 which acts as a plasma control electrode is disposed and is connected to a power supply 45 so that a positive potential with respect to the plasma generating chamber 14 is applied to the anode 44. Reference numeral 44A represents an insulator. The plasma potential can be controlled in response to the potential applied to the anode 44 so that the ion extraction efficiency can be improved. It is preferable that a positive potential from a power supply 46 is applied to the plasma generating chamber. The ion source shown in FIG. 26 is substantially similar to that shown in FIG. 18 except the cylindrical anode 44 is disposed as described above.

Figure 27:
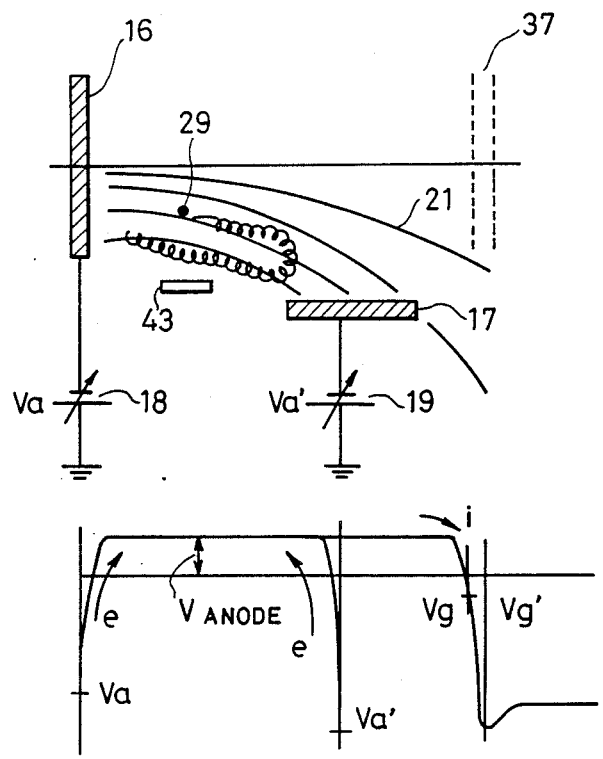
FIG. 27 illustrates the motion of γ (gamma) electrons and the spatial potential distribution in the ion source shown in FIG. 26.

FIG. 27 illustrates the motion of high-speed secondary electrons and the spatial potential distribution in the embodiment shown in FIG. 26. As described in detail above, when the high-speed ions impinge on the surfaces of the targets to which are applied the negative voltages Va and Va', respectively, the high-energy secondary electrons ($\gamma$ electrons) 29 are emitted from the surfaces of the targets. The $\gamma$ electrons emitted from the targets are reflected by the electric field established on the targets so that they make a reciprocal motion between the targets while making a cyclotron motion about the magnetic flux 21 extended between the targets. The $\gamma$ electrons are confined between the targets until their energy becomes lower than the electron-confining energy of the magnetic flux. During this period, because of collisions between the electrons and the neutral particles, the ionization is accelerated. In addition, because of the interaction between the high-energy electron beam reciprocating between the targets and the plasma, the ionization of neutral particles is further enhanced. As described above, high-density plasma can be generated even in a low pressure gas.

When no anode is provided and when the sputtering power is increased, the plasma potential is decreased to approach the potential applied to the ion extracting grids. As a result, the ions in the plasma are not accelerated to the ion extracting grids and at a sputtering power in excess of a certain level, the ion extraction efficiency is decreased.

On the other hand, when the anode is maintained at a predetermined potential, even when the sputtering power is increased, the plasma potential is maintained at a level substantially equal to the anode potential and remains unchanged so that the ions in the plasma are accelerated in a stable manner in the direction of the ion extracting grid maintained at a potential $V_g'$. As a result, the extracted ion current is increased with the increase of the sputtering power; that is, the density of the plasma.

Figure 28:
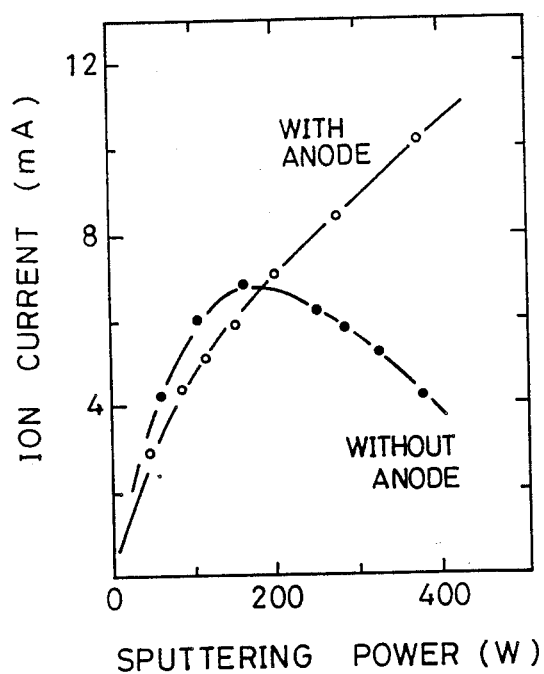
FIG. 28 is a diagram illustrating the dependence of the extracted ion current on the sputtering power.

FIG. 28 illustrates the comparison of the variation in the extracted ion current $I_i$ in response to the variation in sputtering power $P_{dc}$ between an ion source with the anode 44 and an ion source without an anode. When no anode is provided, the plasma potential drops when the sputtering power $P_{dc}$ rises in excess of 200 W so that the ion extraction efficiency is decreased. On the other hand, in the case of the ion source with the anode, the higher the sputtering power $P_{dc}$, the higher the ion current $I_i$.

Figure 29:
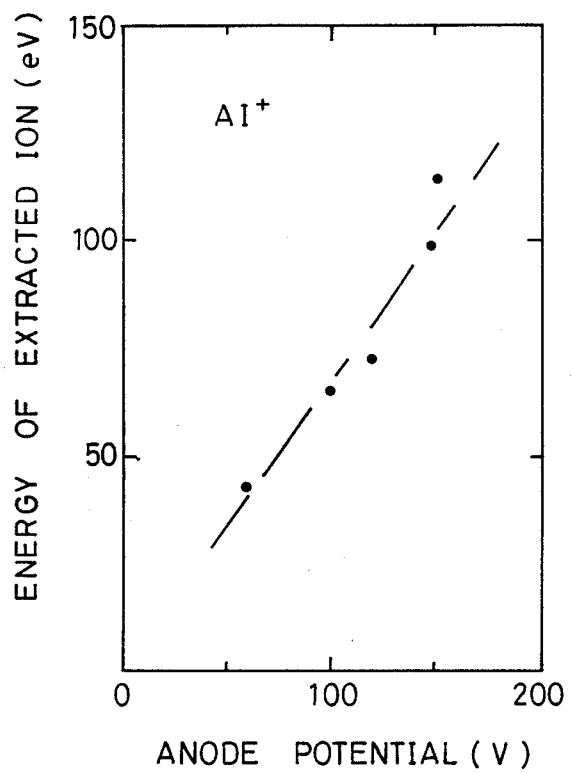
FIG. 29 is a diagram illustrating the dependence of the extracted ion energy on the anode potential.

In response to the potential applied to the anode, the energy of the ions extracted from the plasma can be controlled. FIG. 29 illustrates the variation in energy of extracted ions in response to the variation in anode potential. When the anode potential is varied from 0 to 200 V, the energy of extracted ions vary from 20 to 160 eV.

Figure 30:
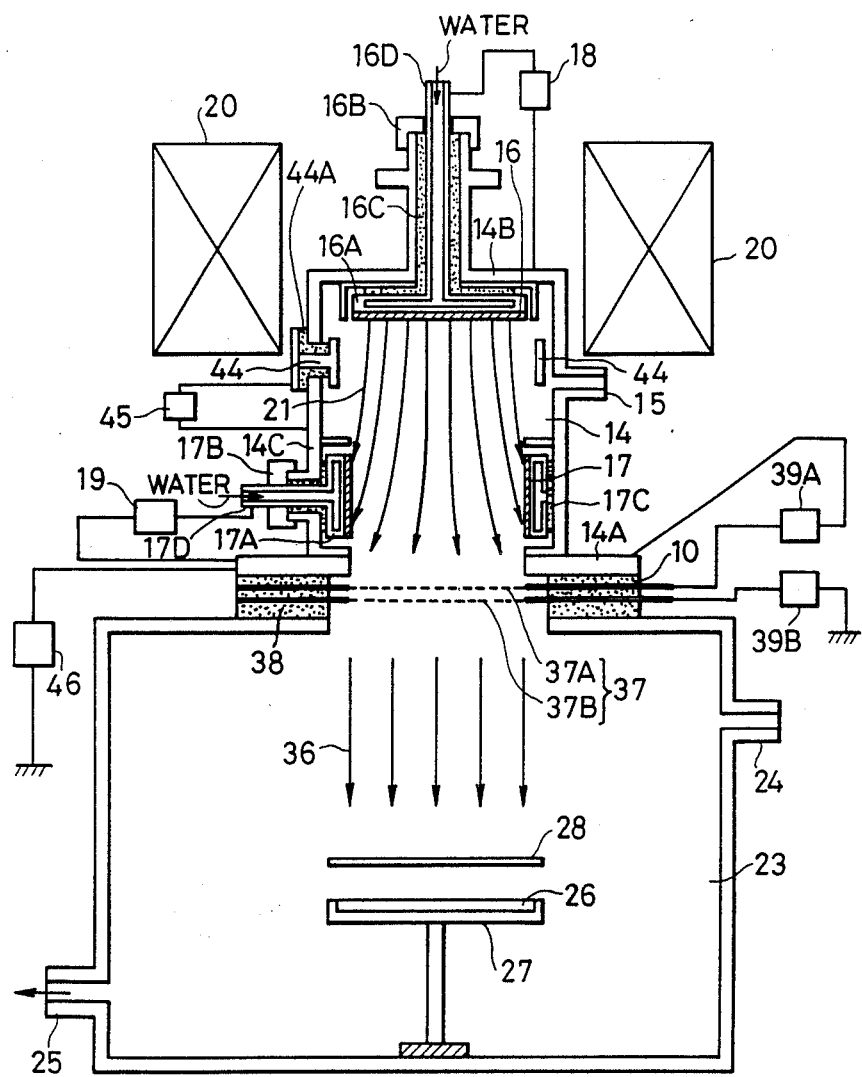
FIG. 30 is a sectional view of a film forming apparatus to which is applied the sputtering type ion source shown in FIG. 26.
Figure 31:
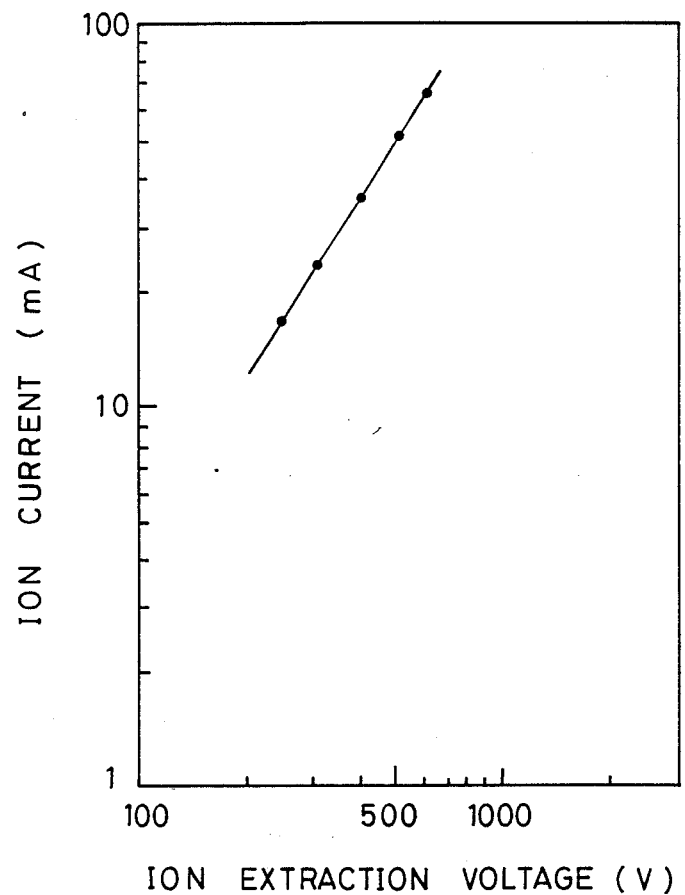
FIG. 31 illustrates an example of ion extraction characteristics.

FIG. 30 illustrates a thin film forming apparatus equipped with the ion source of the type shown in FIG. 26. The results of the experiments of forming thin films over the surfaces of substrates by extracting Al ions by utilizing this apparatus will be described below. Sputtering of a cylindrical aluminum target 17 was carried while maintaining the power applied to the latter between 300 and 600 W. FIG. 31 illustrates ion extraction characteristics. During sputtering, +70 V with respect to the plasma generating chamber was applied to the cylindrical anode 44. The ion extraction voltage; that is, the voltage of the plasma producing chamber 14 plus the voltage applied to the cylindrical anode 44, is plotted along the abscissa. Under the conditions, the energy of the extracted ions was maintained at 300 eV while the substrate holder was not heated, the Al thin films were grown over the surface of substrate of room temperature at a deposition rate ranging from 1 to 12 nm/min continuously for a long period of time in a stable and efficient manner.

Figure 32:
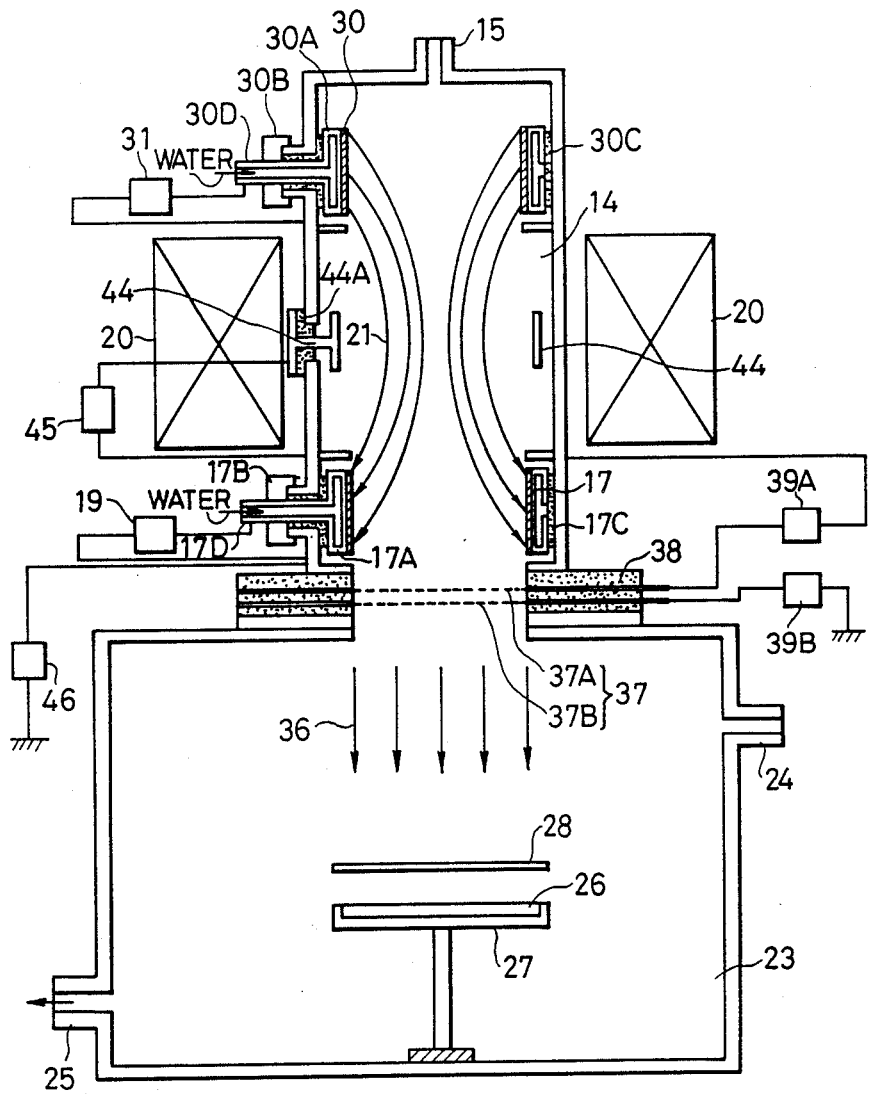
FIG. 32 is a sectional view of a film forming apparatus to which is applied a seventh embodiment of a sputtering type ion source in accordance with the present invention.

FIG. 32 illustrates a thin film forming apparatus equipped with a seventh embodiment of an ion source in accordance with the present invention which is substantially similar in construction to the embodiment shown in FIG. 21 except that a cylindrical anode 44 is disposed within the plasma generating chamber 14. The sputtering type ion source of this embodiment was used to form aluminum thin films while the power applied to the cylindrical aluminum targets 17 and 30 was maintained at +70 V with respect to the plasma generating chamber 14. Under the conditions that the energy of extracted ions was maintained at 300 eV and the substrate holder was not heated and maintained at room temperature, the deposition of thin aluminum films was carried out at a deposition rate ranging from 1–12 nm/min continuously for a long period of time in a stable and efficient manner.

It is apparent that a plasma control anode may be applied to an ion source in which is used one cylindrical target in which the lines of magnetic force leave one end thereof and enter the other end thereof.

In the embodiments shown in FIGS. 26, 30 and 32, an electromagnet was used to establish a required pattern of the magnetic field but it is also apparent that a desired pattern of the magnetic field may be obtained by using various permanent magnets or combinations thereof.

Furthermore, in the above-described embodiments, the plasma control anode has been described as being in the form of a cylinder, but it is to be understood that it may be in the form of a flat plate, a wire or the like.

Figure 33:
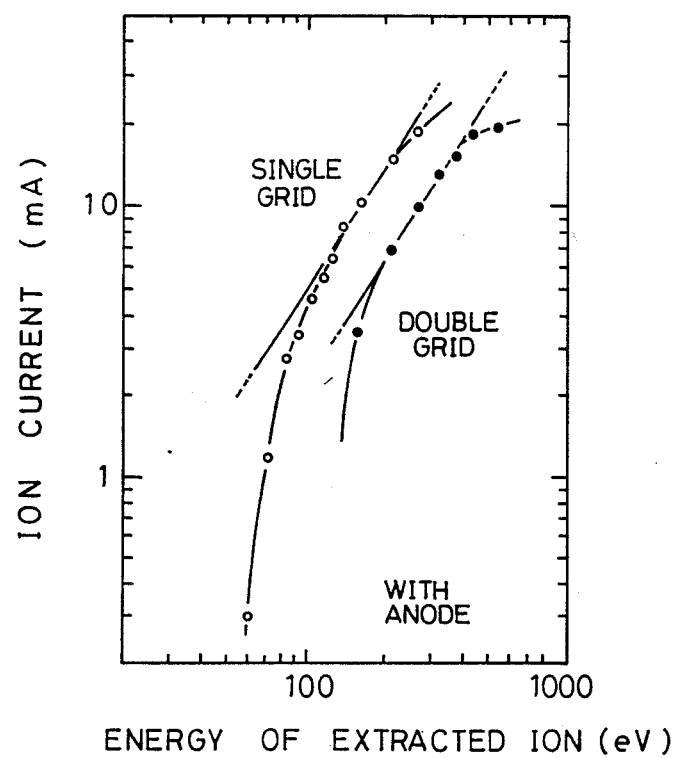
FIG. 33 is a diagram illustrating the relationship between the energy of the extracted ions and the ion current.

Although in the embodiments described above, the ion extracting grid assembly has been described as comprising two perforated grids, measurement of the characteristics of the single perforated grid was also made. FIG. 33 illustrates the relationships between the energy of the extracted ions and the ion current of the double perforated grid type and the single perforated grid type, respectively.

The two perforated grid type comprises a screen grid disposed on the side of the plasma and an acceleration grid on the side of the substrate. When the potential applied to the screen grid is lower than the plasma potential or when a suitable negative potential is applied thereto, the increase in density of plasma due to the emission of secondary electrons can be enhanced. In the above-described embodiments, the screen grid with −50 V with respect to the plasma generating chamber. On the other hand, the acceleration grid has the function of accelerating the ions passing through the screen grid toward the substrate. In the above-described embodiments, voltage ranging from −100 to −1000 V was applied to the acceleration grid with respect the plasma generating chamber.

Meanwhile, it becomes possible to extract further high-current ions by the single grid type which has only one acceleration grid and no screen grid. As a result, the single grid is subjected to the direct bombardment of the plasma so that the grid is consumed. It is, therefore, preferable that the single grid type is used in a low energy region of 500 eV/or less.

As described above, according to the present invention, high-density plasma can be generated in the plasma generating chamber. By utilizing the generated high-density plasma the sputtering is carried out to grow the film over the surface of the substrate even at a low gas pressure and at a low temperature with a high efficiency continuously for a long period of time in a stable manner. By using the apparatus in accordance with the present invent on, highly pure thin films almost completely free from any defects can be continuously grown on the substrates maintained at low temperatures, at a high deposition rate in a highly stable manner. Furthermore, according to the present invention, by sputtering utilizing a high-density plasma, the extraction of ions can be carried out at a low gas pressure continuously for a long period of time. Moreover, in the cases of the ion sources in accordance with the present invention, the ion spieces which can be extracted are not limited so that the extraction of highly pure metal ions and the synthesis of non-equilibrium substances at low temperatures can be realized. The ion sources in accordance with the present invention can be utilized in the growth of high-quality and almost defect-free thin films over the surfaces of substrate maintained at low temperatures, at a high deposition rate continuously in a stable state, or in etching process of the surfaces of materials.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A thin film forming apparatus comprising:
   a plasma generating chamber into which a gas is introduced to generate plasma;
   a first target and a second target made of materials to be sputtered and disposed at both end portions of an interior of said plasma generating chamber, respectively, one of said first and second targets having the form of a tube and the other of said targets having the form of a plate;
   at least one power supply for applying a negative potential to said first and second targets;
   magnetic means for establishing a magnetic field within said plasma generating chamber and inducing magnetic flux leaving one of said first and second targets and entering the other target; and
   a specimen chamber communicated with said plasma generating chamber on the side of said tubular target and incorporating therein a substrate holder.

2. A thin film forming apparatus as claimed in claim 1, wherein said tubular target is a polygonal tubular target.

3. A thin film forming apparatus as claimed in claim 1, which further comprises an auxiliary magnetic field producing means for correcting the magnetic field established by said magnetic means.

4. An ion source, comprising:
   a plasma generating chamber into which is introduced a gas to generate plasma;
   a first target and a second target made of a material to be sputtered, and disposed at both end portions of an interior of said plasma generating chamber, respectively, at least of said first and second targets having the form of a tube;
   at least one power supply for applying a negative potential with respect to said plasma generating chamber to said first and second targets;
   means for establishing a magnetic field within said plasma generating chamber and inducing magnetic flux leaving one of said first and second targets and entering the other target; and
   an ion extracting mechanism for extracting ions in said plasma in a direction parallel to an axis of said tubular target, said ion extracting mechanism being disposed in the vicinity of one end of said plasma generating chamber at which said tubular target is disposed.

5. An ion source as claimed in claim 4, wherein one of said first and second targets is in the form of a tube while the other is in the form of a flat plate.

6. An ion source as claimed in claim 4, wherein both of said first and second targets are in the form of a tube.

7. An ion source as claimed in claim 4, wherein two specimen chambers are communicated with both ends of said plasma generating chamber, respectively.

8. An ion source as claimed in claim 4, wherein said first and second targets are the opposite end portions, respectively, of one tubular target.

9. An ion source as claimed in claim 4, wherein said tubular target is a polygonal tubular target.

10. An ion source as claimed in claim 4, which further comprises an auxiliary magnetic field producing means for correcting the magnetic field established by said magnetic means.

11. An ion source as claimed in claim 4, which further comprises a plasma control electrode disposed within said plasma generating chamber.

12. An ion source as claimed in claim 4, wherein said ion extracting mechanism comprises two perforated grids.

13. An ion source as claimed in claim 4, wherein said ion extracting mechanism comprises a single perforated grid.

14. A thin film forming apparatus, comprising:
   a plasma generating chamber into which is introduced a gas to generate a plasma;
   a first target and a second target made of a material to be sputtered and disposed at both end portions of an interior of said plasma generating chamber, respectively, at least one of said first and second targets having the form of a tube;
   at least one power supply for applying a negative potential with respect to said plasma generating chamber to said first and second targets;
   means for establishing a magnetic field within said plasma generating chamber and inducing magnetic flux leaving one of said first and second targets and entering the other target;

a specimen chamber communicated with said plasma generating chamber on the side of said tubular target and incorporating wherein a substrate holder; and an ion extracting mechanism for extracting ions in said plasma in a direction parallel to an axis of said tubular target, said ion extracting mechanism being disposed in the vicinity of one end of said plasma generating chamber at which said tubular target is disposed.

15. A thin film forming apparatus as claimed in claim 14, which further comprises an auxiliary magnetic field producing means for correcting the magnetic field established by said magnetic means.

16. A thin film forming apparatus as claimed in claim 14, which further comprises a plasma control electrode disposed within said plasma generating chamber.

17. A thin film forming apparatus as claimed in claim 14, wherein said ion extracting mechanism comprises two perforated grids.

18. A thin film forming apparatus as claimed in claim 14, wherein said ion extracting mechanism comprises a single perforated grid.

19. A plasma generating apparatus, comprising:
a plasma generating chamber into which is introduced a gas to generate a plasma;
a first target and a second target made of a material to be sputtered and disposed in the vicinity of both end portions of interior of said plasma generating chamber, respectively, one of said first and second targets having the form of a tube and the other of said targets having the form of a flat plane;
at least one power supply for applying a negative potential to said first and second targets; and
means for establishing a magnet field within said plasma generating chamber and inducing magnetic flux leaving one of said first and second targets and entering the other target.

* * * * *